US012563880B2

(12) United States Patent
Yun et al.

(10) Patent No.: US 12,563,880 B2
(45) Date of Patent: Feb. 24, 2026

(54) DISPLAY DEVICE INCLUDING THE SAME A PIXEL INCLUDING A FIRST ELECTRODE AND A SECOND ELECTRODE INCLUDING A REFLECTIVE CONDUCTIVE MATERIAL

(71) Applicant: Samsung Display Co., LTD., Yongin-si (KR)

(72) Inventors: Hae Ju Yun, Yongin-si (KR); Soo Hyun Moon, Yongin-si (KR); Woo Guen Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 661 days.

(21) Appl. No.: 17/953,170

(22) Filed: Sep. 26, 2022

(65) Prior Publication Data

US 2023/0102618 A1     Mar. 30, 2023

(30) Foreign Application Priority Data

Sep. 28, 2021    (KR) ........................ 10-2021-0128095

(51) Int. Cl.
| | |
|---|---|
| *H10H 29/14* | (2025.01) |
| *G09G 3/3233* | (2016.01) |
| *H01L 23/00* | (2006.01) |
| *H01L 25/075* | (2006.01) |

(52) U.S. Cl.
CPC ......... *H10H 29/142* (2025.01); *G09G 3/3233* (2013.01); *H01L 24/05* (2013.01); *H01L 24/08* (2013.01); *G09G 2300/0426* (2013.01); *G09G 2300/0842* (2013.01); *G09G 2320/0233* (2013.01); *H01L 25/0753* (2013.01); *H01L 2224/05572* (2013.01); *H01L 2224/05573* (2013.01); *H01L 2224/08238* (2013.01)

(58) Field of Classification Search
CPC .... H10H 29/142; G09G 3/3233; H01L 24/05; H01L 24/08
USPC ........................................................ 257/98
See application file for complete search history.

(56) References Cited

U.S. PATENT DOCUMENTS

| | | | |
|---|---|---|---|
| 12,119,436 B2 | 10/2024 | Lee et al. | |
| 2018/0211945 A1* | 7/2018 | Cok | H01L 25/13 |
| 2020/0217998 A1* | 7/2020 | Jung | H10K 59/38 |
| 2021/0217739 A1 | 7/2021 | Lee et al. | |

(Continued)

FOREIGN PATENT DOCUMENTS

| | | | | |
|---|---|---|---|---|
| KR | 10-2020-0102607 A | 1/2020 | | |
| KR | 10-2020-0088946 A | 7/2020 | | |
| WO | WO-2020171323 A1 * | 8/2020 | | G09G 3/32 |

*Primary Examiner* — Norman D Richards
*Assistant Examiner* — Colin Russell Mccutcheon
(74) *Attorney, Agent, or Firm* — Womble Bond Dickinson (US) LLP

(57) ABSTRACT

A display device includes a base layer, a color filter layer on the base layer and including a color filter located at an emission area, a light emitting element layer on the color filter layer and including a light emitting element located at the emission area, a first electrode on a first end of the light emitting element, and a second electrode on a second end of the light emitting element, a circuit layer on the light emitting element layer and including circuit elements and lines connected to the first electrode and the second electrode, and pads on the circuit layer and connected to the lines, and the first electrode and the second electrode may include a reflective conductive material.

17 Claims, 14 Drawing Sheets

(56)                 References Cited

U.S. PATENT DOCUMENTS

2021/0233820 A1*    7/2021  Liu ....................... H01L 25/167
2022/0102604 A1     3/2022  Do et al.

* cited by examiner

SPX: SPX1, SPX2, SPX3

FIG. 8

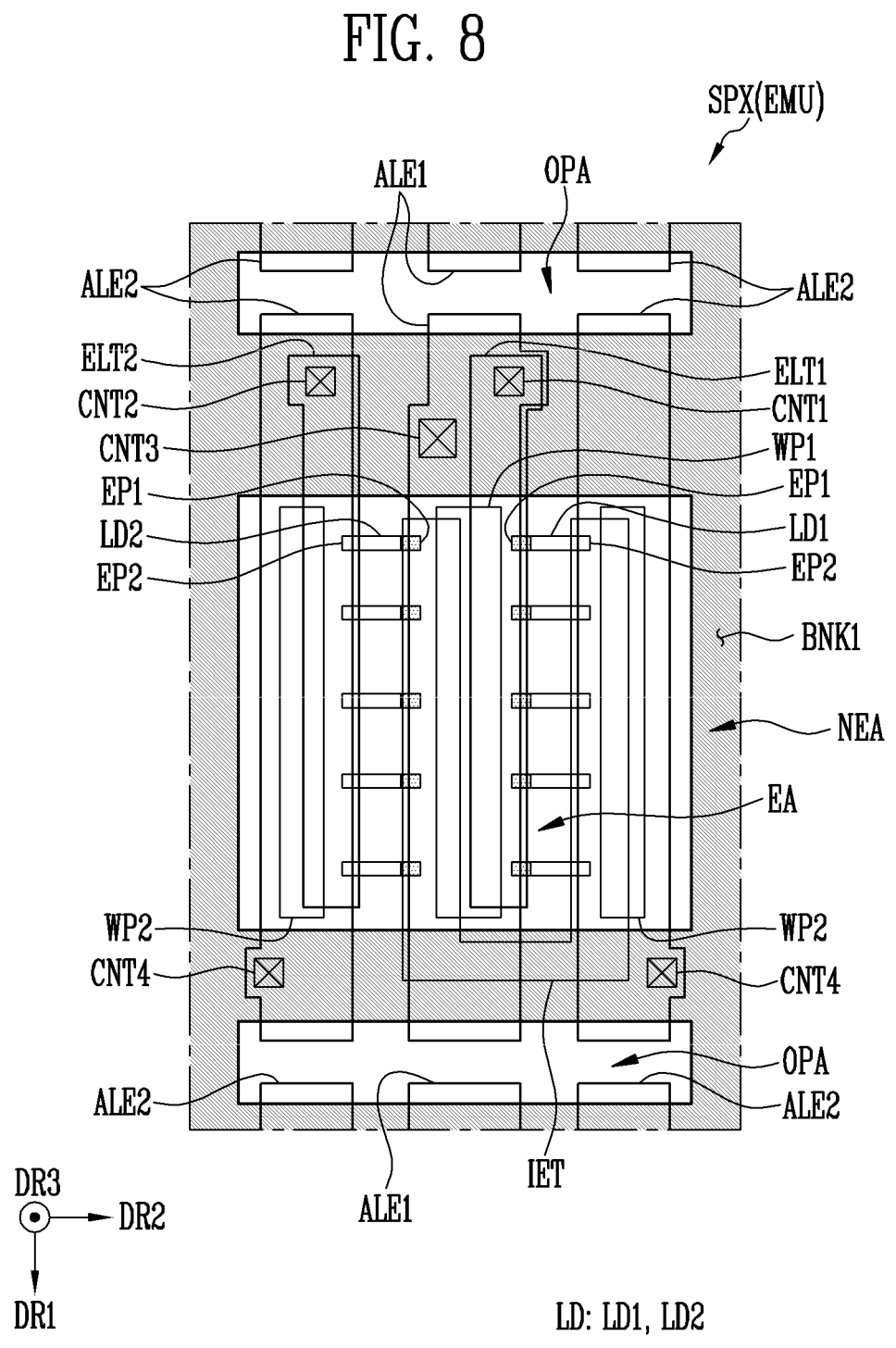

SPX(EMU)

ALE1    OPA

ALE2    ALE2

ELT2    ELT1
CNT2    CNT1
CNT3    WP1
EP1    EP1
LD2    LD1
EP2    EP2

BNK1

NEA

EA

WP2    WP2
CNT4    CNT4

OPA
ALE2    ALE2

IET
ALE1

DR3
DR2
DR1

LD: LD1, LD2

LL: PL1, PL2, SGL
PD: PD1, PD2, PD3

DISPLAY DEVICE INCLUDING THE SAME A PIXEL INCLUDING A FIRST ELECTRODE AND A SECOND ELECTRODE INCLUDING A REFLECTIVE CONDUCTIVE MATERIAL

CROSS-REFERENCE TO RELATED APPLICATION

This application claims priority to and the benefit of Korean Patent Application No. 10-2021-0128095, filed on Sep. 28, 2021, the entire content of which is incorporated by reference herein.

BACKGROUND

1. Field

The present disclosure relates to a pixel and a display device including the same.

2. Description of the Related Arts

Recently, interest in information display is increasing. Accordingly, research and development of a display device has been continuously conducted.

SUMMARY

One or more embodiments of the present disclosure provide a pixel and a display device including the same that is capable of reducing a non-display area and preventing damage to a base layer.

The aspects and features of embodiments of the present disclosure are not limited to the above-described aspects and features, and other aspects and features that are not described will be clearly understood by those skilled in the art from the following description.

A display device according to one or more embodiments of the present disclosure may include a base layer, a color filter layer on the base layer and including a color filter located at an emission area, a light emitting element layer on the color filter layer and including a light emitting element located at the emission area, a first electrode on a first end of the light emitting element, and a second electrode on a second end of the light emitting element, a circuit layer on the light emitting element layer and including circuit elements and lines connected to the first electrode and the second electrode, and pads on the circuit layer and connected to the lines, and the first electrode and the second electrode may include a reflective conductive material.

In one or more embodiments, the light emitting element layer may further include a first alignment electrode adjacent to the first end of the light emitting element and located under the first electrode, and a second alignment electrode adjacent to the second end of the light emitting element and located under the second electrode.

In one or more embodiments, the first alignment electrode and the second alignment electrode may include a transparent conductive material.

In one or more embodiments, the light emitting element layer may further include a first wall pattern under the first alignment electrode and protruding a portion of the first alignment electrode upward from a periphery of the first end of the light emitting element, and a second wall pattern under the second alignment electrode and protruding a portion of the second alignment electrode upward from a periphery of the second end of the light emitting element.

In one or more embodiments, the light emitting element layer may further include a first bank in a non-emission area around the emission area to be around the emission area.

In one or more embodiments, the first electrode, the second electrode, the first alignment electrode, and the second alignment electrode may extend from the emission area to the non-emission area.

In one or more embodiments, the light emitting element layer may further include a first insulating layer covering the first alignment electrode and the second alignment electrode and located between the first electrode and the first alignment electrode and between the second electrode and the second alignment electrode, a first contact portion including a portion that passes through the first insulating layer in the non-emission area and connects the first electrode and the first alignment electrode, and a second contact portion including a portion that passes through the first insulating layer in the non-emission area and connects the second electrode and the second alignment electrode.

In one or more embodiments, the circuit layer may include a first transistor connected to the first alignment electrode, a first power line connected to the first transistor, and a second power line connected to the second alignment electrode.

In one or more embodiments, the display device may further include a third contact portion connecting the first alignment electrode and the first transistor, and a fourth contact portion connecting the second alignment electrode and the second power line.

In one or more embodiments, the third contact portion and the fourth contact portion may be in the non-emission area.

In one or more embodiments, the circuit layer may include a first conductive layer including a source electrode and a drain electrode of the first transistor, a second conductive layer including a gate electrode of the first transistor, a semiconductor layer including a semiconductor pattern of the first transistor, and a third conductive layer including at least one of the first power line and the second power line. The first conductive layer, the second conductive layer, the semiconductor layer, and the third conductive layer may be sequentially located on the light emitting element layer.

In one or more embodiments, the circuit layer may further include an insulating layer on the third conductive layer.

In one or more embodiments, the pads may be on the insulating layer and may be connected to the lines through contact holes passing through the insulating layer.

In one or more embodiments, the display device may further include a light conversion layer between the color filter layer and the light emitting element layer.

In one or more embodiments, the light conversion layer may include a light conversion pattern in the emission area, and a second bank around the light conversion pattern. The light conversion pattern may include at least one of light conversion particles that convert light of a first color emitted from the light emitting element into light of a second color, and light scattering particles.

In one or more embodiments, the display device may further include a circuit board on the circuit layer and including bonding pads connected to the pads.

In one or more embodiments, the display device may further include a pixel including the light emitting element, and the pixel may emit light in a direction toward the base layer.

In one or more embodiments, the display device may further include a display panel including the pixel. The circuit board may be on the display panel to overlap a display area in which the pixel is located.

In one or more embodiments, the first electrode and the second electrode may include at least one metal layer.

A pixel according to one or more embodiments of the present disclosure may include a color filter on a base layer, a light emitting element layer on the color filter and including a light emitting element, a first electrode on a first end of the light emitting element, and a second electrode on a second end of the light emitting element, and a circuit layer on the light emitting element layer and including circuit elements connected to the first electrode and the second electrode, and the first electrode and the second electrode may include a reflective conductive material.

Details of other embodiments are included in the detailed description and drawings.

In accordance with the pixel and the display device including the same according to one or more embodiments of the present disclosure, the circuit layer may be disposed on one surface of a direction opposite to the base layer in a thickness direction of the display panel, and the pads may be formed on the circuit layer to connect the pads to the circuit layer. Accordingly, the pads may be formed on one surface (for example, a front surface) opposite to an image display surface (for example, a rear surface) of the display panel without forming a via hole in the base layer.

According to such an embodiment of the present disclosure, the pads may be on the display area of the display panel. Accordingly, a non-display area of the display device may be reduced. In addition, even though the pads are formed on an opposite surface of the image display surface, the pads may be connected to the lines of the circuit layer without passing through the base layer. Accordingly, damage to the base layer may be prevented.

Effect, aspects, and features of embodiments of the present disclosure are not limited by the contents illustrated above, and more various effects, aspects, and features are included in the present specification.

BRIEF DESCRIPTION OF THE DRAWINGS

The above and other aspects and features of embodiments of the present disclosure will become more apparent by describing in further detail embodiments thereof with reference to the accompanying drawings, in which:

FIGS. 7 and 8 are plan views illustrating a sub-pixel according to one or more embodiments of the present disclosure;

DETAILED DESCRIPTION

Figure 1:
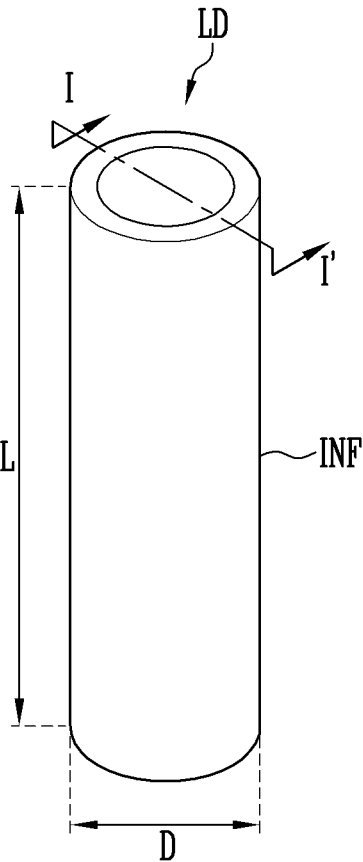
FIG. 1 is a perspective view illustrating a light emitting element according to one or more embodiments of the present disclosure.

The present disclosure may be modified in various ways and may have various forms, and specific embodiments will be illustrated in the drawings and described in detail herein. In the following description, the singular forms also include the plural forms unless the context clearly includes the singular.

The present disclosure is not limited to the embodiments disclosed below, and may be modified in various forms and may be implemented. In addition, each of the embodiments disclosed below may be implemented alone or in combination with at least one of other embodiments.

In the drawings, some components that are not directly related to a characteristic of the present disclosure may be omitted to clearly represent the present disclosure. Throughout the drawings, the same or similar components will be given by the same reference numerals and symbols as much as possible even though they are shown in different drawings, and repetitive descriptions will be omitted.

Figure 2:
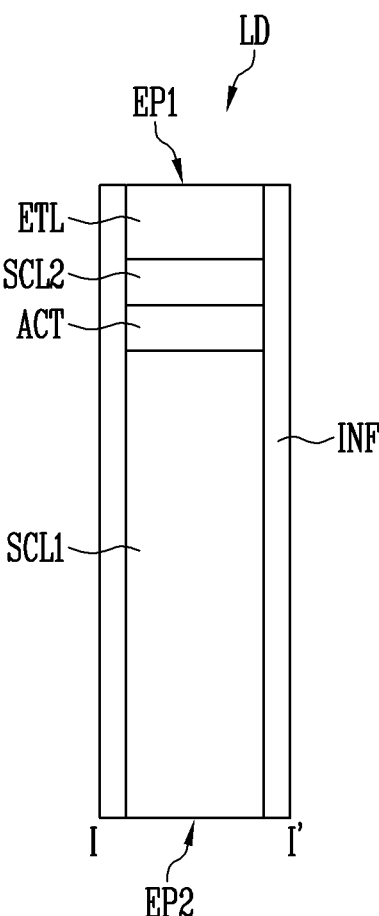
FIG. 2 is a cross-sectional view illustrating a light emitting element according to one or more embodiments of the present disclosure.

FIG. 1 is a perspective view illustrating a light emitting element LD according to one or more embodiments of the present disclosure. FIG. 2 is a cross-sectional view illustrating a light emitting element LD according to one or more embodiments of the present disclosure. For example, FIG. 1 illustrates an example of the light emitting element LD that may be used as a light source of a display device according to one or more embodiments of the present disclosure, and FIG. 2 illustrates an example of a cross-section of the light emitting element LD taken along the line I~I' of FIG. 1.

Referring to FIGS. 1 and 2, the light emitting element LD may include a first semiconductor layer SCL1, an active layer ACT, and a second semiconductor layer SCL2, which are sequentially disposed along one direction (for example, a length direction), and an insulating film INF around (or surrounding) an outer surface (e.g., an outer circumferential surface, for example, a side surface) of the first semiconductor layer SCL1, the active layer ACT, and the second semiconductor layer SCL2. In addition, the light emitting element LD may selectively further include an electrode layer ETL disposed on the second semiconductor layer SCL2. In this case, the insulating film INF may or may not at least partially be around (or surround) an outer surface (e.g., an outer circumferential surface) of the electrode layer ETL. In addition, according to one or more embodiments, the light emitting element LD may further include another electrode layer disposed on one surface (for example, a lower surface) of the first semiconductor layer SCL1.

In one or more embodiments, the light emitting element LD is provided in a bar (or rod) shape extending along the one direction, and may have a first end EP1 and a second end EP2 at both ends of a length direction (or a thickness direction) of the light emitting element LD. The first end EP1 may include a first surface (or an upper surface) and/or a peripheral region thereof of the light emitting element LD, and the second end EP2 may include a second surface (or a lower surface) and/or a peripheral region thereof of the light emitting element LD. For example, the electrode layer ETL and/or the second semiconductor layer SCL2 may be disposed on the first end EP1 of the light emitting element LD, and the first semiconductor layer SCL1 and/or at least one electrode layer connected to the first semiconductor layer SCL1 may be disposed on the second end EP2 of the light emitting element LD.

In describing one or more embodiments of the present disclosure, the term "bar shape" may include a rod-like shape or a bar-like shape having an aspect ratio greater than 1, such as a circular column or a polygonal column, and a shape of a cross section thereof is not particularly limited. For example, a length L of the light emitting element LD may be greater than a diameter D (or a width of the cross section) thereof.

The first semiconductor layer SCL1, the active layer ACT, the second semiconductor layer SCL2, and the electrode layer ETL may be sequentially disposed along a direction from the second end EP2 to the first end EP1 of the light emitting element LD. For example, the first semiconductor layer SCL1 may be disposed at the second end EP2 of the light emitting element LD, and the electrode layer ETL may be disposed at the first end EP1 of the light emitting element LD. Alternatively, at least one other electrode layer may be disposed at the second end EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include any one semiconductor material from among InAlGaN, GaN, AlGaN, InGaN, AlN, and InN, and may be an N-type semiconductor layer doped with a dopant such as Si, Ge, or Sn. However, the material configuring the first semiconductor layer SCL1 is not limited thereto, and various materials in addition to the above-described materials may configure the first semiconductor layer SCL1.

The active layer ACT may be disposed on the first semiconductor layer SCL1 and may be formed in a single-quantum well or multi-quantum well structure. A position of the active layer ACT may be variously changed according to a type of the light emitting element LD. In one or more embodiments, the active layer ACT may emit light having a wavelength of 400 nm to 900 nm, and may use a double hetero-structure.

A clad layer doped with a conductive dopant may be selectively formed on and/or under the active layer ACT. For example, the clad layer may be formed of an AlGaN layer or an InAlGaN layer. According to one or more embodiments, a material such as AlGaN or AlInGaN may be used to form the active layer ACT, and various materials in addition to the above-described materials may configure the active layer ACT.

When a voltage equal to or greater than a threshold voltage is applied between both ends of the light emitting element LD, the light emitting element LD emits light while electron-hole pairs are combined in the active layer ACT. By controlling light emission of the light emitting element LD using this principle, the light emitting element LD may be used as a light source of various light emitting devices including a pixel of a display device.

The second semiconductor layer SCL2 may be disposed on the active layer ACT and may be a semiconductor layer of a second conductive type that is different from that of the first semiconductor layer SCL1. For example, the second semiconductor layer SCL2 may include a P-type semiconductor layer including a P-type dopant. For example, the second semiconductor layer SCL2 may include at least one semiconductor material from among InAlGaN, GaN, AlGaN, InGaN, AlN, and InN, and may be a P-type semiconductor layer doped with a dopant such as Mg. However, the material configuring the second semiconductor layer SCL2 is not limited thereto, and various materials in addition to the above-described materials may configure the second semiconductor layer SCL2.

In one or more embodiments, the first semiconductor layer SCL1 and the second semiconductor layer SCL2 may have different lengths (or thicknesses) in the length direction of the light emitting element LD. For example, the first semiconductor layer SCL1 may have a length (or a thickness) longer (or thicker) than that of the second semiconductor layer SCL2 along the length direction of the light emitting element LD. Accordingly, the active layer ACT may be positioned closer to the first end EP1 than the second end EP2.

The electrode layer ETL may be disposed on the second semiconductor layer SCL2. The electrode layer ETL may protect the second semiconductor layer SCL2, and may be an electrode for smoothly connecting the second semiconductor layer SCL2 to an external electrode (e.g., a predetermined electrode), line, or the like. For example, the electrode layer ETL may be an ohmic contact electrode or a Schottky contact electrode.

In describing embodiments of the present disclosure, the term "connection (or access)" may mean a physical and/or electrical connection (or access) inclusively. In addition, the term "connection (or access)" may mean a direct connection (or access) or an indirect connection (or access) inclusively, and may mean an integral connection (or access) and a non-integral connection (or access) inclusively.

The electrode layer ETL may be substantially transparent or translucent. Accordingly, light generated from the light emitting element LD may pass through the electrode layer ETL and may be emitted to the outside of the light emitting element LD. In one or more embodiments, when the light generated from the light emitting element LD is emitted to the outside of the light emitting element LD without passing through the electrode layer ETL, the electrode layer ETL may be formed to be opaque.

In one or more embodiments, the electrode layer ETL may include metal or metal oxide. For example, the electrode layer ETL may be formed using a metal such as chromium (Cr), titanium (Ti), aluminum (Al), gold (Au), nickel (Ni), or copper (Cu), oxide or alloy thereof, a transparent conductive material such as indium tin oxide (ITO), indium zinc oxide (IZO), indium tin zinc oxide (ITZO), zinc oxide (ZnO), or indium oxide ($In_2O_3$), and the like alone or in combination.

The insulating film INF may expose the electrode layer ETL (or the second semiconductor layer SCL2) and the first semiconductor layer SCL1 (or another electrode layer provided at the second end EP2 of the light emitting element LD), respectively, at the first and second ends EP1 and EP2 of the light emitting element LD.

In case that the insulating film INF is provided to cover a surface of the light emitting element LD, for example, the outer surface (e.g., the outer circumferential surface) of the first semiconductor layer SCL1, the active layer ACT, the second semiconductor layer SCL2, and/or the electrode layer ETL, a short defect through the light emitting element LD may be prevented. Accordingly, electrical stability of the light emitting element LD may be secured.

In case that the insulating film INF is provided on the surface of the light emitting element LD, a surface defect of the light emitting element LD may be reduced or minimized, and thus a lifespan and efficiency may be improved. In addition, in case that the insulating film INF is formed on each light emitting element LD, a short defect may be prevented from occurring between the light emitting elements LD even though a plurality of light emitting elements LD are closely disposed with each other In one or more embodiments of the present disclosure, the light emitting element LD may be manufactured through a surface treatment process. For example, by performing the surface treatment on the light emitting element LD using a hydrophobic material, when the plurality of light emitting elements LD are mixed in a fluid solution (or an ink) and supplied to each emission area (for example, an emission area of a pixel), the light emitting elements LD may be uniformly dispersed in the solution without being non-uniformly aggregated.

The insulating film INF may include a transparent insulating material. Accordingly, light generated in the active layer ACT may pass through the insulating film INF and may be emitted to the outside of the light emitting element LD. For example, the insulating film INF may include at least one insulating material from among $SiO_2$ or silicon oxide ($SiO_x$) that is not determined to $SiO_2$, $Si_3N_4$ or silicon nitride ($SiN_x$) that is not determined to $Si_3N_4$, $Al_2O_3$ or aluminum oxide ($Al_xO_y$) that is not determined to $Al_2O_3$, and $TiO_2$ or titanium oxide ($Ti_xO_y$) that is not determined to $TiO_2$, but is not limited thereto.

The insulating film INF may be configured as a single layer or multiple layers. For example, the insulating film INF may be formed of a double film.

In one or more embodiments, the insulating film INF may be partially etched (or removed) in a region corresponding to at least one of the first end EP1 and the second end EP2 of the light emitting element LD. For example, the insulating film INF may be etched to have a rounded shape in the at least one area, but the shape of the insulating film INF is not limited thereto.

In one or more embodiments, the light emitting element LD may have a small size of a range from nanometer to micrometer. For example, each light emitting element LD may have the diameter D (or a width of a cross section) and/or the length L of the range from nanometer to micrometer. For example, the light emitting element LD may have the diameter D of a range of several hundred nanometers and the length L of a range of several micrometers. However, a size of the light emitting element LD may be changed.

A structure, a shape, and/or a type of the light emitting element LD may be changed according to one or more embodiments. For example, the light emitting element LD may be formed in another structure and/or shape such as a core-shell structure.

A light emitting device including the light emitting element LD may be used in various types of devices that require a light source. For example, a plurality of light emitting elements LD may be arranged in the pixel (or a sub-pixel) of the display device, and the light emitting elements LD may be used as a light source of the pixel. The light emitting element LD may be used in other types of devices that require a light source, such as a lighting device.

Figure 3:
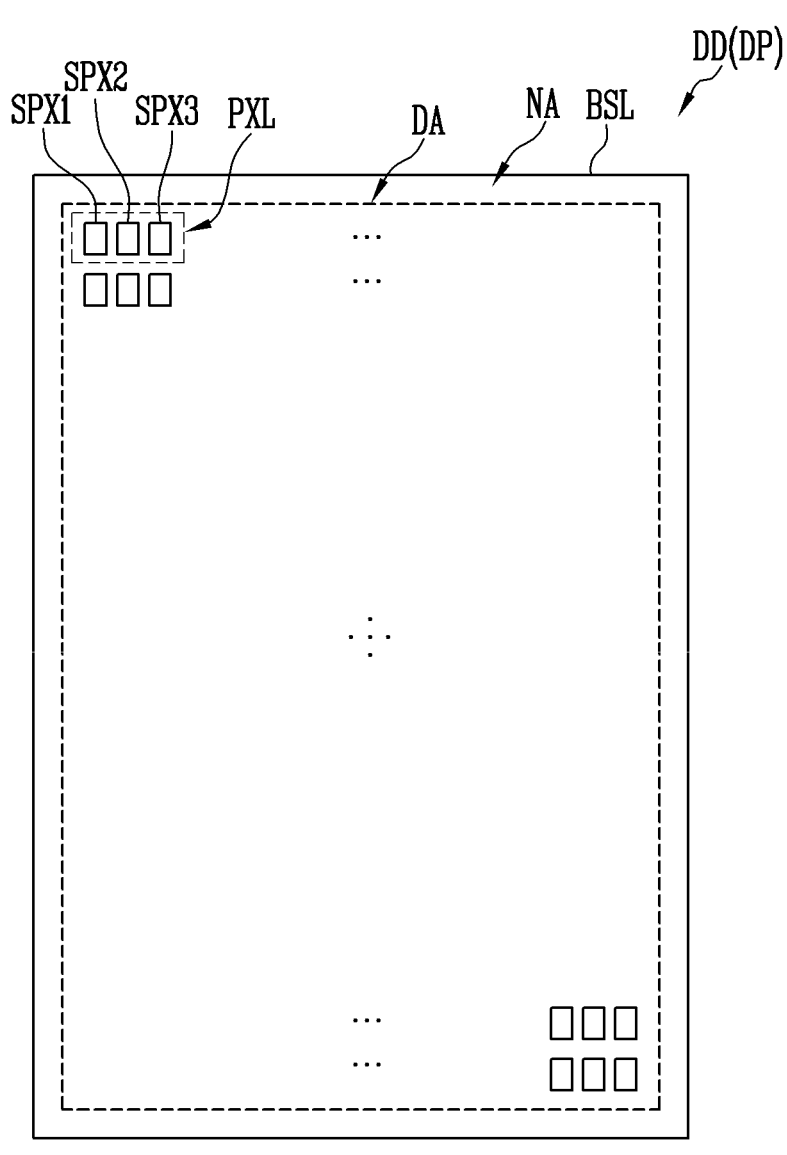
FIG. 3 is a plan view illustrating a display device according to one or more embodiments of the present disclosure.
Figure 3:
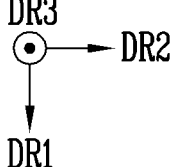

FIG. 3 is a plan view illustrating a display device DD according to one or more embodiments of the present disclosure. In FIG. 3, a structure of the display device DD is briefly shown based on the display panel DP including the display area DA. The display device DD may further include a driving circuit (for example, a scan driver, a data driver, a timing controller, and the like) for driving the pixels PXL. At least a portion of the driving circuit may be formed and/or disposed inside the display panel DP, or the driving circuit may be provided outside the display panel DP.

Referring to FIG. 3, the display device DD may include a base layer BSL and pixels PXL provided on the base layer BSL.

The base layer BSL may be a base member for configuring the display panel DP, and may include a display area DA for displaying an image and a non-display area NA except for the display area DA. The display area DA may configure a screen on which the image is displayed, and the non-display area NA may be an area except for the display area DA. For example, the non-display area NA may be around (or surround) the display area DA along the edge or periphery of the display area DA.

The display panel DP may be provided in various shapes. For example, the display panel DP may be provided in a rectangular plate shape, but is not limited thereto. For example, the display panel DP may have a shape of a circular shape, an elliptical shape, or the like. In addition, the display panel DP may include an angled corner and/or a curved corner.

For convenience, in FIG. 3, the display panel DP have a rectangular plate shape. In addition, a vertical direction (for example, a column direction or a Y direction) of the display panel DP is indicated as a first direction DR1, a horizontal direction (for example, a row direction or an X direction) of the display panel DP is indicated as a second direction DR2, and a thickness direction (or a height direction) of the display panel DP is indicated as a third direction DR3.

The display area DA may have various shapes. For example, the display area DA may have various shapes including a rectangle, a circle, or an ellipse. In one or more embodiments, the display area DA may have a shape matching the shape of the display panel DP.

The pixels PXL may be arranged in the display area DA. For example, the display area DA may include a plurality of pixel areas in which each pixel PXL is disposed.

Each pixel PXL may include a plurality of sub-pixels SPX. For example, the pixel PXL may include a first sub-pixel SPX1, a second sub-pixel SPX2, and a third sub-pixel SPX3.

The first, second, and third sub-pixels SPX1, SPX2, and SPX3 may emit light of different colors. For example, the first, second, and third sub-pixels SPX1, SPX2, and SPX3 may emit blue, green, and red light, respectively. The number, type, disposition structure, and/or the like of the sub-pixels SPX configuring the pixel PXL may be variously changed according to one or more embodiments.

In one or more embodiments, each sub-pixel SPX may be a sub-pixel of a specific color, and may include a light emitting element LD that generates light of the specific color. In one or more embodiments, at least some of the sub-pixels SPX may include light emitting elements LD that generate light of a first color (for example, blue), and a light conversion pattern that converts the light of the first color into light of a second color (for example, red or green) may be disposed in an emission area. Accordingly, the light of the second color may be generated using the at least some of the sub-pixels SPX.

For example, each of the first, second, and third sub-pixels SPX1, SPX2, and SPX3 may include the light emitting element LD that generates the light of the first color, and light conversion patterns including a second color (for example, green) quantum dot and a third color (for example, red) quantum dot may be disposed in emission areas of the second and third sub-pixels SPX2 and SPX3, respectively. Accordingly, the first, second, and third sub-pixels SPX1, SPX2, and SPX3 may emit light of the first color, light of the second color, and light of the third color, respectively.

Each sub-pixel SPX may include at least one light source driven by at least one control signal (for example, a scan signal and a data signal) and/or power (for example, first power and second power). In one or more embodiments, the light source may include the light emitting element LD according to the embodiment of FIGS. 1 and 2, for example, rod-shape light emitting element LD having a small size of a range of nanometer to micrometer. In addition, various types of light emitting elements may be used as the light source of the sub-pixel SPX. For example, in one or more embodiments, the light source of the sub-pixel SPX may be configured using an inorganic or organic light emitting element having a different size range, an inorganic light emitting element having a core-shell structure, or the like.

The pixels PXL may have a structure according to at least one of the embodiments described below. For example, the pixels PXL may have a structure in which any one of the embodiments to be described later is applied, or a structure in which at least two embodiments are applied in combination.

The non-display area NA may be disposed around the display area DA. In the non-display area NA, lines connected to the pixels PXL of the display area DA, a built-in circuit unit, and/or pads (for example, PD of FIG. 12) may be disposed.

In one or more embodiments, the pixels PXL may emit light toward a first surface of the display device DD (for example, a rear or lower surface of the display panel DP), and the pads may be disposed on a second surface (for example, a front surface or an upper surface of the display panel DP) of the display device DD. In this case, at least some of the pads may be disposed on the display area DA.

As the pads are disposed on the display area DA, the non-display area NA of the display device DD may be reduced. In one or more embodiments, the display device DD in which the non-display area NA is reduced may be used to configure a tiling display device. For example, when a tiling display device is configured using a plurality of display devices DD in which the non-display area NA is reduced, a distance between the display areas DA of adjacent display devices DD may be reduced, and thus, visual recognition of a boundary between the display devices DD may be reduced or minimized. Accordingly, a seamless tiling display device may be configured.

Figure 4:
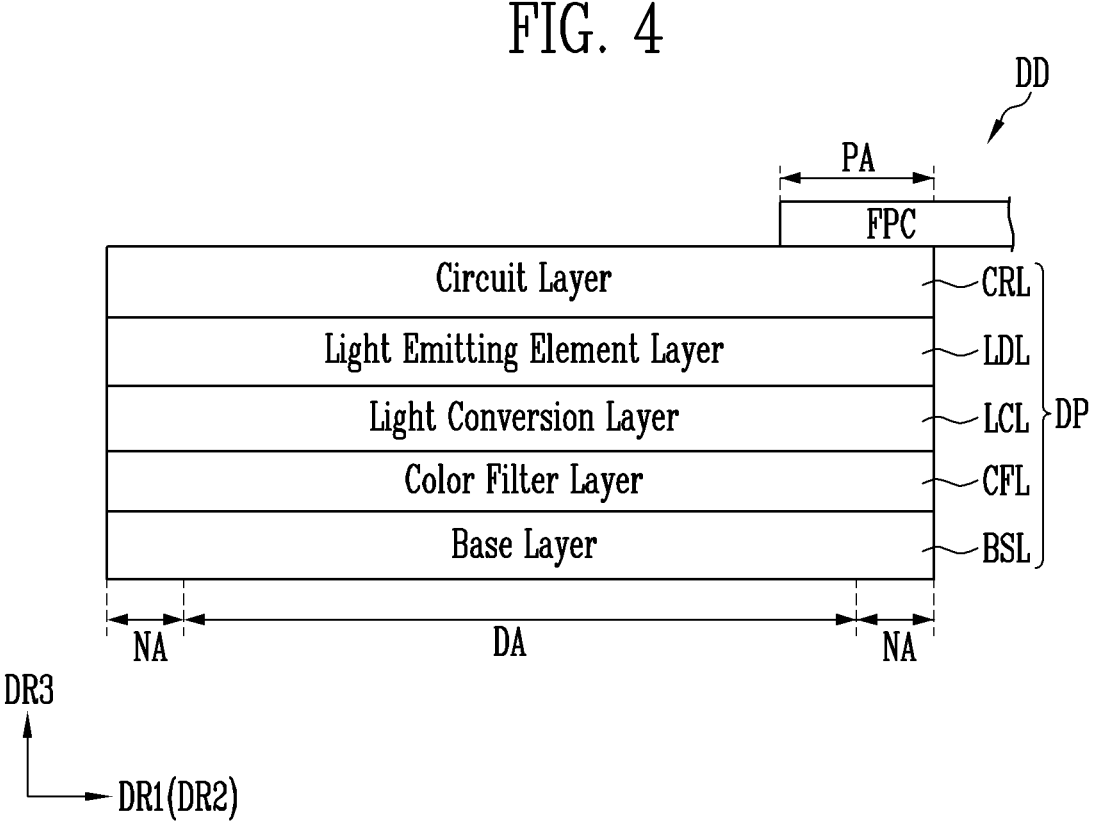
FIG. 4 is a cross-sectional view schematically illustrating a configuration of a display device according to one or more embodiments of the present disclosure.

FIG. 4 is a cross-sectional view schematically illustrating a configuration of a display device DD according to one or more embodiments of the present disclosure.

Referring to FIGS. 3 and 4, the display device DD may include the display panel DP and a circuit board FPC connected to the display panel DP.

The display panel DP may include a base layer BSL, and a color filter layer CFL, a light emitting element layer LDL, and a circuit layer CRL sequentially disposed on one surface of the base layer BSL. In addition, the display panel DP may selectively further include a light conversion layer LCL disposed between the color filter layer CFL and the light emitting element layer LDL.

The base layer BSL may be a rigid or flexible substrate (or film). In one or more embodiments, in case that the base layer BSL is the rigid substrate, the base layer BSL may be one of a glass substrate, a quartz substrate, a glass ceramic substrate, and a crystalline glass substrate. In one or more embodiments, in case that the base layer BSL is the flexible substrate, the base layer BSL may be one of a film substrate and a plastic substrate including a polymer organic material. In addition, the base layer BSL may include fiber glass reinforced plastic (FRP). In addition, the base layer BSL may be formed of various materials or substrates. In addition, the base layer BSL may be a substrate of a single layer or multiple layers.

The color filter layer CFL may be disposed on the base layer BSL. The color filter layer CFL may be disposed on a path through which light generated from the light emitting element layer LDL is emitted. For example, in the display device DD in which the light emitting element layer LDL emits the light in a direction of the base layer BSL (for example, a rear surface emission type display device DD), the color filter layer CFL may be disposed between the base layer BSL and the light emitting element layer LDL.

The light conversion layer LCL may be disposed on the color filter layer CFL. The light conversion layer LCL may include at least one type of color conversion particles (or wavelength conversion particles) and/or light scattering particles. For example, the light conversion layer LCL may include the green quantum dot provided in the emission areas of the second sub-pixels SPX2 and the red quantum dot provided in the emission areas of the third sub-pixels SPX3. In addition, the light conversion layer LCL may further include the light scattering particles provided in the emission areas of the first, second and/or third sub-pixels SPX1, SPX2, and/or SPX3.

The light emitting element layer LDL may be disposed on the light conversion layer LCL. The light emitting element layer LDL may include light emitting units configuring a light source of each pixel PXL (or each sub-pixel SPX). Each light emitting unit may include at least one light emitting element, and may selectively further include at least one electrode connected to the light emitting element. In one or more embodiments, each light emitting unit may include the light emitting element LD according to the embodiment of FIGS. 1 and 2, and first and second electrodes connected to the first and second ends EP1 and EP2 of the light emitting element LD.

The circuit layer CRL may be disposed on the light emitting element layer LDL. The circuit layer CRL may include circuit elements configuring a pixel circuit of each pixel PXL (or each sub-pixel SPX), and/or various lines connected to the circuit elements and the light emitting units. For example, the circuit layer CRL may include transistors and a capacitor configuring the pixel circuit of each of the sub-pixels SPX, and gate lines, data lines, and power lines connected to each pixel circuit. According to one or more embodiments, the gate lines may include at least scan lines, and may selectively further include other types of control lines. In addition, the circuit layer CRL may further include at least one insulating layer including a protective layer covering the circuit elements and the lines. For example, the protective layer including at least one inorganic insulating layer may be disposed on the uppermost layer of the circuit layer CRL.

The circuit board FPC may be disposed on the circuit layer CRL. For example, the circuit board FPC may be disposed on one area of the display panel DP corresponding to a pad area PA.

The circuit board FPC may be connected to the display panel DP through the pads (for example, PD of FIG. 12) provided on the circuit layer CRL in the pad area PA. For example, the circuit board FPC may include bonding pads (for example, BDP of FIG. 12) connected to the pads of the display panel DP.

In one or more embodiments, at least one driving circuit (for example, the scan driver, the data driver, and/or the timing controller) for driving the display panel DP may be mounted on the circuit board FPC. Alternatively, the driving circuit may not be mounted on the circuit board FPC. In this case, the circuit board FPC may connect between the display panel DP and another circuit board (a main board, or the like) on which the driving circuit is mounted. The circuit board FPC may be a flexible circuit board, but a type of the circuit board FPC is not limited thereto.

Figure 5:
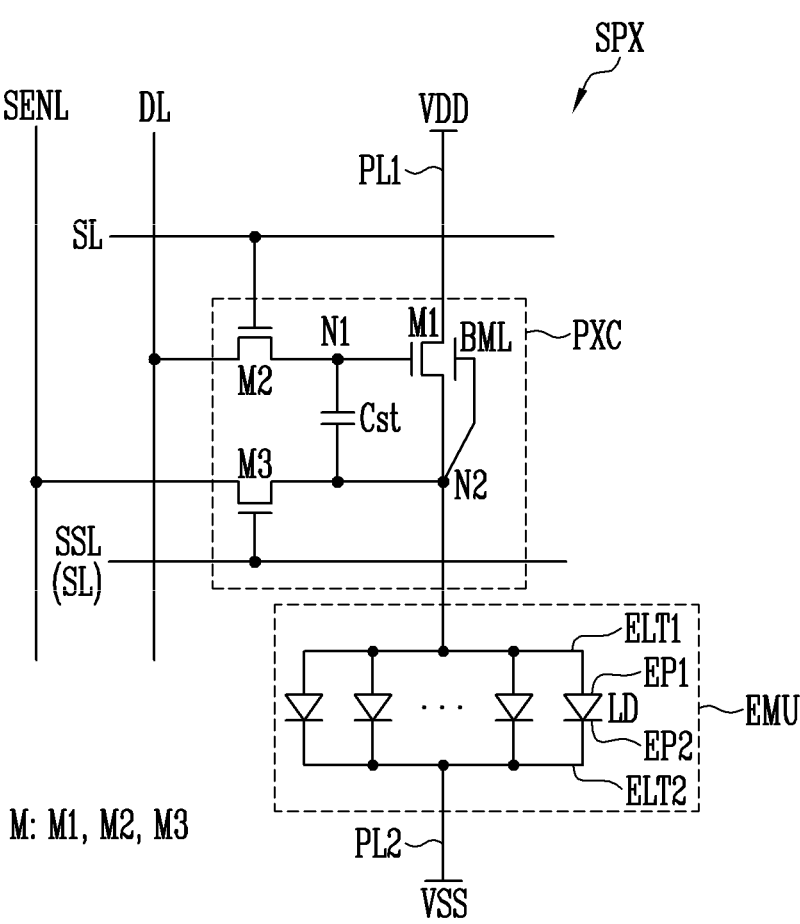
FIGS. 5 and 6 are circuit diagrams illustrating a sub-pixel according to one or more embodiments of the present disclosure.
Figure 6:
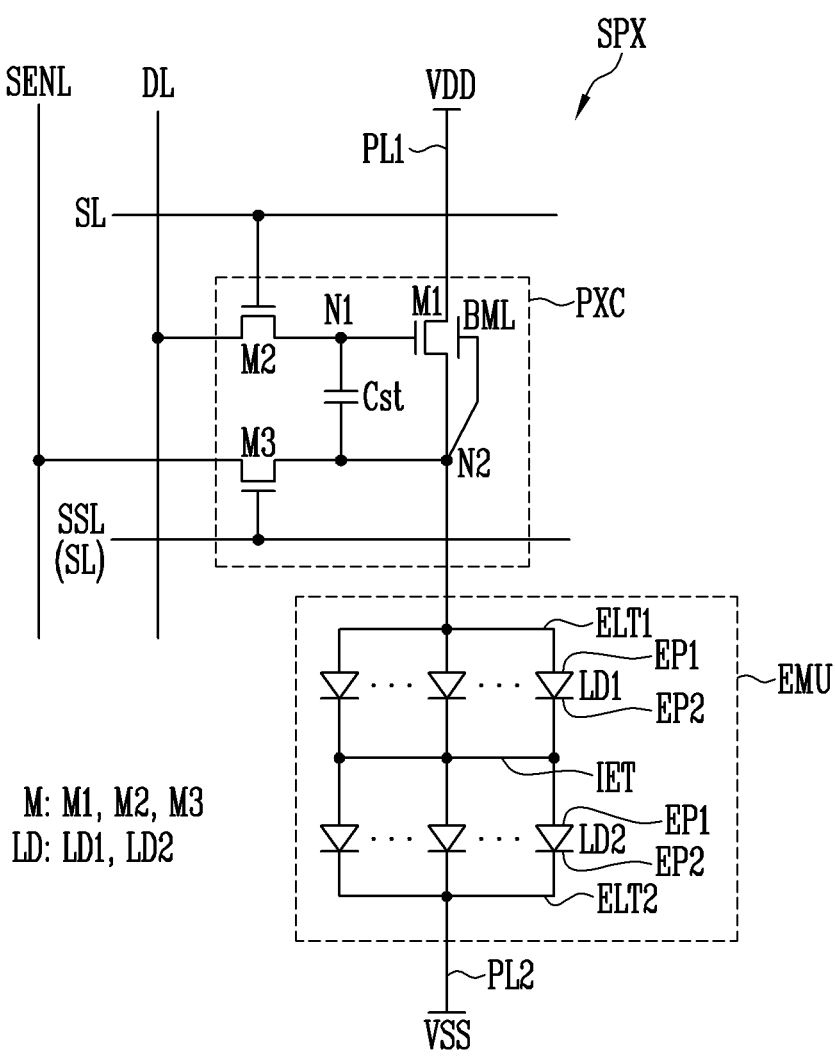

FIGS. 5 and 6 are circuit diagrams illustrating a sub-pixel SPX according to one or more embodiments of the present disclosure. For example, FIGS. 5 and 6 illustrate the sub-pixels SPX including light emitting units EMU of different structures.

According to one or more embodiments, each sub-pixel SPX shown in FIGS. 5 and 6 may be any one of the sub-pixels SPX included in each pixel PXL of FIG. 3. In addition, the sub-pixels SPX disposed in the display area DA may have structures substantially the same as or similar to each other.

Referring to FIGS. 5 and 6, the sub-pixel SPX may be connected to a scan line SL, a data line DL, a first power line PL1, and a second power line PL2. In addition, the sub-pixel SPX may be selectively further connected to at least one other power line and/or signal line. For example, the sub-pixel SPX may be further connected to a sensing line SENL (or an initialization power line) and/or a control line SSL.

The sub-pixel SPX may include the light emitting unit EMU for generating light of a luminance corresponding to each data signal. In addition, the sub-pixel SPX may further include a pixel circuit PXC for driving the light emitting unit EMU.

The pixel circuit PXC may be connected to the scan line SL and the data line DL, and may be connected between the first power line PL1 and the light emitting unit EMU. For example, the pixel circuit PXC may be connected to the scan line SL to which a first scan signal is supplied, the data line DL to which the data signal is supplied, the first power line PL1 to which first power VDD (for example, a voltage of the first power VDD) is supplied, and a first electrode ELT1 of the light emitting unit EMU.

In addition, the pixel circuit PXC may be selectively further connected to the control line SSL to which a second scan signal is supplied, and the sensing line SENL connected to the initialization power (or reference power) or a sensing circuit in correspondence with a display period or a sensing period. In one or more embodiments, the second scan signal may be a signal that is the same as or different from the first scan signal. When the second scan signal is the signal that is the same signal as the first scan signal, the control line SSL may be integrated with the scan line SL.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be connected between the first power line PL1 and a second node N2. The second node N2 may be a node to which the pixel circuit PXC and the light emitting unit EMU are connected. For example, the second node N2 may be a node to which one electrode (for example, a source electrode) of the first transistor M1 and the first electrode ELT1 (for example, an anode electrode) of the light emitting unit EMU are connected. A gate electrode of the first transistor M1 may be connected to a first node N1. The first transistor M1 may control a driving current supplied to the light emitting unit EMU in response to a voltage of the first node N1. For example, the first transistor M1 may be a driving transistor of the sub-pixel SPX.

In one or more embodiments, the first transistor M1 may further include a bottom metal layer BML (also referred to as a "second gate electrode" or a "top metal layer"). In one or more embodiments, the bottom metal layer BML may be connected to the one electrode (for example, the source electrode) of the first transistor M1.

In one or more embodiments in which the first transistor M1 includes the bottom metal layer BML, a back-biasing technique (or a sync technique) for moving a threshold voltage of the first transistor M1 in a negative direction or a positive direction by applying a back-biasing voltage to the bottom metal layer BML of the first transistor M1 may be applied. In addition, when the bottom metal layer BML is disposed to overlap a semiconductor pattern configuring a channel of the first transistor M1, an operation characteristic of the first transistor M1 may be stabilized by blocking light incident on the semiconductor pattern.

The second transistor M2 may be connected between the data line DL and the first node N1. In addition, a gate electrode of the second transistor M2 may be connected to the scan line SL. The second transistor M2 may be turned on when the first scan signal of a gate-on voltage (for example, a high level voltage) is supplied from the scan line SL, to connect the data line DL and the first node N1.

For each frame period, a data signal of a corresponding frame may be supplied to the data line DL, and the data signal may be transmitted to the first node N1 through the second transistor M2 during a period in which the first scan signal of the gate-on voltage is supplied. For example, the second transistor M2 may be a switching transistor for transmitting each data signal into the sub-pixel SPX.

A first electrode of the capacitor Cst may be connected to the first node N1 and a second electrode may be connected to the second node N2. The capacitor Cst stores a charge (e.g., a voltage) corresponding to the data signal supplied to the first node N1 during each frame period.

The third transistor M3 may be connected between the second node N2 and the sensing line SENL. In addition, a gate electrode of the third transistor M3 may be connected to the control line SSL (or the scan line SL). The third transistor M3 may be turned on when a second scan signal (or the first scan signal) of a gate-on voltage (for example, a high level voltage) is supplied from the control line SSL, to transmit an initialization voltage (or a reference voltage) supplied to the sensing line SENL to the second node N2 or transmit a voltage of the second node N2 to the sensing line SENL. The voltage of the second node N2 transmitted to the sensing circuit through the sensing line SENL may be provided to the driving circuit (for example, the timing controller), and may be used to compensate for a characteristic deviation of the pixels PXL (or the sub-pixels SPX).

Although in FIGS. 5 and 6, all of the transistors M included in the pixel circuit PXC are N-type transistors, the present disclosure is not limited thereto. For example, at least one of the first, second, and third transistors M1, M2, and M3 may be changed to a P-type transistor. In addition, a structure and a driving method of the sub-pixel SPX may be variously changed according to one or more embodiments.

The light emitting unit EMU may include the first electrode ELT1, a second electrode ELT2, and at least one light emitting element LD, which is connected between the first power VDD and second power VSS. For example, the light emitting unit EMU may include the first electrode ELT1 connected to the first power VDD through the pixel circuit PXC and/or the first power line PL1, the second electrode ELT2 connected to the second power VSS through the second power line PL2, and at least one light emitting element LD connected between the first electrode ELT1 and the second electrode ELT2.

The first power VDD and the second power VSS may have different potentials. For example, the first power VDD may be a high potential pixel power, and the second power VSS may be a low potential pixel power. A potential difference between the first power VDD and the second power VSS may be equal to or greater than a threshold voltage of the light emitting elements LD. The voltage of the first power VDD and the voltage of the second power VSS may be supplied to the sub-pixel SPX through the first power line PL1 and the second power line PL2, respectively.

In one or more embodiments, the light emitting unit EMU may include a plurality of light emitting elements LD connected in parallel in a forward direction between the first electrode ELT1 and the second electrode ELT2 as shown in FIG. 5. For example, the first ends EP1 of the light emitting elements LD may be connected to the first electrode ELT1, and the second ends EP2 of the light emitting elements LD may be connected to the second electrode ELT2. In one or more embodiments, the sub-pixel SPX may include a plurality of light emitting elements LD connected only in series between the first electrode ELT1 and the second electrode ELT2, or include only a single light emitting element LD connected in the forward direction between the first electrode ELT1 and the second electrode ELT2.

In one or more embodiments, the light emitting unit EMU may include a plurality of light emitting elements LD connected in a series-parallel combination between the first electrode ELT1 and the second electrode ELT2 as shown in FIG. 6. When the light emitting unit EMU includes a plurality of light emitting elements LD divided and arranged in at least two series stages, the light emitting unit EMU may further include at least one intermediate electrode IET connected between the first electrode ELT1 and the second electrode ELT2. For example, the light emitting unit EMU may include the first electrode ELT1, the intermediate electrode IET, and the second electrode ELT2 sequentially connected between the pixel circuit PXC and the second power line PL2. In addition, the light emitting unit EMU may include a plurality of light emitting elements LD including at least one first light emitting element LD1 (for example, a plurality of first light emitting elements LD1) connected in a forward direction between the first electrode ELT1 and the intermediate electrode IET, and at least one second light emitting element LD2 (for example, a plurality of second light emitting elements LD2) connected in the forward direction between the intermediate electrode IET and the second electrode ELT2. For example, the first ends EP1 and the second ends EP2 of the first light emitting elements LD1 may be connected to the first electrode ELT1 and the intermediate electrode IET, respectively, and the first ends EP1 and the second ends EP2 of the second light emitting elements LD2 may be connected to the intermediate electrode IET and the second electrode ELT2, respectively. Although FIG. 6 shows the light emitting unit EMU of a two-stage series-parallel structure, the number of series stages configuring the light emitting unit EMU may be changed. For example, the light emitting unit EMU may include a plurality of light emitting elements LD divided and connected to three or more series stages.

Each light emitting element LD may configure each effective light source. Such effective light sources may be gathered to configure a light source of the sub-pixel SPX.

The light emitting elements LD may emit light with a luminance corresponding to a driving current supplied through the pixel circuit PXC. During each frame period, the pixel circuit PXC may supply a driving current corresponding to the data signal to the light emitting unit EMU. The driving current supplied to the light emitting unit EMU may be flowed to the second power VSS through the light emitting elements LD. Accordingly, each light emitting element LD may emit light with the luminance corresponding to the current flowing therethrough, and the light emitting unit EMU may emit light with the luminance corresponding to the driving current.

Although in FIGS. 5 and 6, only the light emitting elements LD (that is, effective light sources) connected in the forward direction between the first electrode ELT1 and the second electrode ELT2 are shown, the present disclosure is not limited thereto. For example, the light emitting unit EMU may further include at least one ineffective light source in addition to the light emitting elements LD configuring each effective light source. For example, the light emitting unit EMU may further include at least one ineffective light emitting element arranged in a reverse direction between the first electrode ELT1 and the second electrode ELT2, or having at least one floated end.

Figure 7:
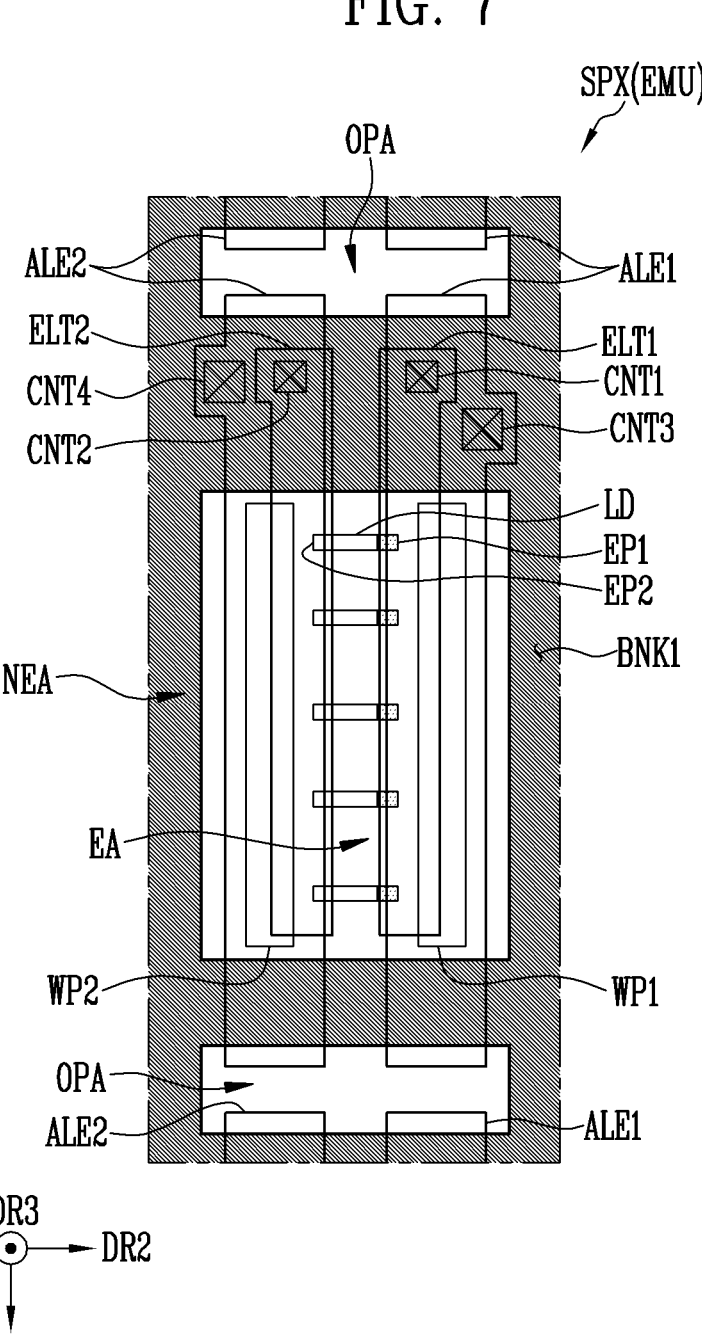

FIGS. 7 and 8 are plan views illustrating a sub-pixel SPX according to one or more embodiments of the present disclosure. FIGS. 7 and 8 illustrate a structure of the sub-pixel SPX according to respective embodiments based on the light emitting unit EMU.

For example, FIG. 7 shows an example of the light emitting unit EMU including the light emitting elements LD connected in parallel between the first electrode ELT1 and the second electrode ELT2 as in the embodiment of FIG. 5, and FIG. 8 shows an example of the light emitting unit EMU including the light emitting elements LD connected in series-parallel between the first electrode ELT1 and the second electrode ELT2 as in the embodiment of FIG. 6.

First, referring to FIGS. 3 to 7, the sub-pixel SPX may include the first electrode ELT1, the second electrode ELT2, and the light emitting elements LD connected between the first and second electrodes ELT1 and ELT2. In addition, the sub-pixel SPX may include a first alignment electrode ALE1 overlapping the first electrode ELT1, a second alignment electrode ALE2 overlapping the second electrode ELT2, a first wall pattern WP1 (also referred to as a "first bank pattern" or a "first pattern") overlapping the first alignment electrode ALE1, and a second wall pattern WP2 (also referred to as a "second bank pattern" or a "second pattern") overlapping the second alignment electrode ALE2. The first and second electrodes ELT1 and ELT2, the light emitting elements LD, the first and second alignment electrodes ALE1 and ALE2, and the first and second wall patterns WP1 and WP2 may be disposed in at least an emission area EA of the sub-pixel SPX. In one or more embodiments, in the emission area EA, from a lower layer close to the base layer BSL, the first and second wall patterns WP1 and WP2, the first and second alignment electrodes ALE1 and ALE2, the light emitting elements LD, and the first and second electrodes ELT1 and ELT2 may be sequentially disposed.

A non-emission area NEA may be disposed around the emission area EA of the sub-pixel SPX, and a first bank BNK1 may be disposed in the non-emission area NEA. For example, the first bank BNK1 may have an opening corresponding to the emission area EA and may be around (or may surround) the emission area EA. In addition, the first bank BNK1 may further include openings OPA corresponding to one area of the non-emission area NEA. Ends of at least one of the first alignment electrode ALE1 and the second alignment electrode ALE2 may be disposed in the openings OPA. Ends of the first electrode ELT1 and the second electrode ELT2 may not be disposed in the openings OPA, or at least one end of at least one of the first electrode ELT1 and the second electrode ELT2 may be disposed in the openings OPA.

Sizes, shapes, and/or positions of the first alignment electrode ALE1, the second alignment electrode ALE2, the first electrode ELT1, and the second electrode ELT2 may be variously changed according to one or more embodiments. In addition, whether the first alignment electrode ALE1 and the first electrode ELT1 are connected and/or a position of a connection portion (for example, a first contact portion CNT1) between the first alignment electrode ALE1 and the first electrode ELT1, and whether the second alignment electrode ALE2 and the second electrode ELT2 are connected and/or a position of a connection portion (for example, a second contact portion CNT2) between the second alignment electrode ALE2 and the second electrode ELT2 may be variously changed according to one or more embodiments. In one or more embodiments, the first alignment electrode ALE1 and the first electrode ELT1 may be electrically connected to each other through the first connection portion CNT1 or the like as in the embodiment of FIG. 7. In one or more embodiments, the first electrode ELT1 may not be directly connected to the first alignment electrode ALE1, and may be directly connected to the pixel circuit PXC (for example, the circuit element of the corresponding pixel circuit PXC disposed in the circuit layer CRL) of the sub-pixel SPX through at least one connection portion. Similarly, the second alignment electrode ALE2 and the second electrode ELT2 may be electrically connected to each other through the second connection portion CNT2 or the like as in the embodiment of FIG. 7. In one or more embodiments, the second electrode ELT2 may not be directly connected to the second alignment electrode ALE2, and may be directly connected to the second power line PL2 (for example, the second power line PL2 disposed on the circuit layer CRL) through at least one connection portion.

The first wall pattern WP1 may be disposed under the first alignment electrode ALE1 to overlap a portion of the first alignment electrode ALE1. The first wall pattern WP1 and the first alignment electrode ALE1 may be positioned around the first ends EP1 of the light emitting elements LD.

The first alignment electrode ALE1 may or may not overlap the light emitting elements LD, and the first wall pattern WP1 may not overlap the light emitting elements LD. For example, the first wall pattern WP1 may be disposed under the first alignment electrode ALE1 in an area that does not overlap the light emitting elements LD. In the area where the first wall pattern WP1 is disposed, the first alignment electrode ALE1 may protrude in an upper direction (for example, the third direction DR3 corresponding to a thickness or height direction of the base layer BSL and the display panel DP).

The second wall pattern WP2 may be disposed under the second alignment electrode ALE2 to overlap a portion of the second alignment electrode ALE2. The second wall pattern WP2 and the second alignment electrode ALE2 may be positioned around the second ends EP2 of the light emitting elements LD.

The second alignment electrode ALE2 may or may not overlap the light emitting elements LD, and the second wall pattern WP2 may not overlap the light emitting elements LD. For example, the second wall pattern WP2 may be disposed under the second alignment electrode ALE2 in an area that does not overlap the light emitting elements LD. In the area where the second wall pattern WP2 is disposed, the second alignment electrode ALE2 may protrude in the upper direction (for example, the third direction DR3).

A light emitting element arrangement area in which the light emitting elements LD are arranged may be defined by the first and second alignment electrodes ALE1 and ALE2 and the first and second wall patterns WP1 and WP2. For example, the light emitting elements LD may be arranged in concave portion formed between the first and second alignment electrodes ALE1 and ALE2 by the first and second alignment electrodes ALE1 and ALE2 and the first and second wall patterns WP1 and WP2.

The first alignment electrode ALE1 may be connected to the first electrode ELT1 through the first contact portion CNT1. For example, the first alignment electrode ALE1 may be electrically connected to the first electrode ELT1 through the first contact portion CNT1. The first contact portion CNT1 may include at least one contact hole and/or via hole. In one or more embodiments, the first contact portion CNT1 may be disposed outside the emission area EA. For example, the first contact portion CNT1 may be disposed in the non-emission area NEA to overlap the first bank BNK1 or may be disposed in an area (hereinafter, a separation area) corresponding to the opening OPA of the first bank BNK1 so as not to overlap the first bank BNK1.

In addition, the first alignment electrode ALE1 may be connected to the pixel circuit PXC of the sub-pixel SPX through a third contact portion CNT3. For example, the first alignment electrode ALE1 may be electrically connected to the first transistor M1 of the pixel circuit PXC disposed in the circuit layer CRL through the third contact portion CNT3. The first electrode ELT1 may be connected to the pixel circuit PXC through the first alignment electrode ALE1. The third contact portion CNT3 may include at least one contact hole and/or via hole. In one or more embodiments, the third contact portion CNT3 may be disposed outside the emission area EA. For example, the third contact portion CNT3 may be disposed in the non-emission area NEA to overlap the first bank BNK1, or may be disposed in the separation area corresponding to the opening OPA of the first bank BNK1 so as not to overlap the first bank BNK1.

The second alignment electrode ALE2 may be connected to the second electrode ELT2 through the second contact portion CNT2. For example, the second alignment electrode ALE2 may be electrically connected to the second electrode ELT2 through the second contact portion CNT2. The second contact portion CNT2 may include at least one contact hole and/or via hole. In one or more embodiments, the second contact portion CNT2 may be disposed outside the emission area EA. For example, the second contact unit CNT2 may be disposed in the non-emission area NEA to overlap the first bank BNK1, or may be disposed in the separation area corresponding to the opening OPA of the first bank BNK1 so not to overlap the first bank BNK1.

In addition, the second alignment electrode ALE2 may be connected to the second power line PL2 through a fourth contact portion CNT4. For example, the second alignment electrode ALE2 may be electrically connected to the second power line PL2 disposed in the circuit layer CRL through the fourth contact portion CNT4. The second electrode ELT2 may be connected to the second power line PL2 through the second alignment electrode ALE2. The fourth contact portion CNT4 may include at least one contact hole and/or via hole. In one or more embodiments, the fourth contact portion CNT4 may be disposed outside the emission area EA. For example, the fourth contact portion CNT4 may be disposed in the non-emission area NEA to overlap the first bank BNK1, or may be disposed in the separation area corresponding to the opening OPA of the first bank BNK1 so not to overlap the first bank BNK1.

The first and second alignment electrodes ALE1 and ALE2 may have various shapes and may be spaced from each other. In one or more embodiments, each of the first and second alignment electrodes ALE1 and ALE2 may have a shape (for example, a bar shape) extending in the first direction DR1 and may be spaced from each other along the second direction DR2. In addition, the first and second alignment electrodes ALE1 and ALE2 may have a shape and/or size similar to or the same as each other, or may have different shapes and sizes. The shape, size, number, and/or mutual disposition structure of the first and second alignment electrodes ALE1 and ALE2 may be variously changed according to one or more embodiments.

The first and second alignment electrodes ALE1 and ALE2 may be formed in at least the emission area EA. In one or more embodiments, the first and second alignment electrodes ALE1 and ALE2 may extend from the emission area EA to the non-emission area NEA.

The first alignment electrode ALE1 may have a pattern separated for each sub-pixel SPX. The second alignment electrode ALE2 may have a pattern separated for each sub-pixel SPX, or the second alignment electrodes ALE2 of the plurality of sub-pixels SPX adjacent along the first direction DR1 may be integrally connected.

In one or more embodiments, before a pixel process for forming the sub-pixels SPX, for example, an alignment of the light emitting elements LD is completed, the first alignment electrodes ALE1 of the sub-pixels SPX may be connected to each other, and the second alignment electrodes ALE2 of the sub-pixels SPX may be connected to each other. For example, before the alignment of the light emitting elements LD is completed, the first alignment electrodes ALE1 of the sub-pixels SPX adjacent along the first direction DR1 may be integrally or non-integrally connected to each other to configure a first alignment line, and the second alignment electrodes ALE2 of the sub-pixels SPX adjacent along the first direction DR1 may be integrally or non-integrally connected to each other to configure a second alignment line.

The first alignment line and the second alignment line may receive a first alignment signal and a second alignment signal, respectively, in an alignment step of the light emitting elements LD. The first and second alignment signals may have different waveforms, potentials and/or phases. Accordingly, an electric field may be formed between the first and second alignment lines, and thus the light emitting elements LD may be aligned between the first and second alignment lines. In addition, the concave portion may be formed in each of the emission areas EA by the first and second wall patterns WP1 and WP2, and thus the light emitting elements LD may be arranged at the concave portion. Accordingly, an area in which the light emitting elements LD are arranged may be more easily controlled. For example, the light emitting elements LD may be arranged in parallel between the first and second alignment lines so that at least a central area of the light emitting elements LD is positioned between the first and second alignment lines.

After the alignment of the light emitting elements LD is completed, the first alignment line may be cut off in each separation area corresponding to the openings OPA of the first bank BNK1 to separate the first alignment electrodes ALE1 of the sub-pixels SPX from each other. Accordingly, the sub-pixels SPX may be individually driven.

In one or more embodiments, the first alignment electrodes ALE1 of the sub-pixels SPX may be separated, and the second alignment electrodes ALE2 of the sub-pixels SPX may be separated, concurrently (e.g., simultaneously). For example, after the alignment of the light emitting elements LD is completed, the first and second alignment lines may be cut off in each separation area. Accordingly, the first and second alignment electrodes ALE1 and ALE2 of the sub-pixels SPX may be formed as respective individual patterns.

For example, the first alignment electrodes ALE1 of the sub-pixels SPX adjacent along the first direction DR1 may be separated from each other in each separation area positioned between the emission areas EA of the sub-pixels SPX adjacent along the first direction DR1. Similarly, the second alignment electrodes ALE2 of the sub-pixels SPX adjacent along the first direction DR1 may be separated from each other in each separation area positioned between the emission areas EA of the sub-pixels SPX adjacent along the first direction DR1.

The light emitting elements LD may be disposed between the first and second alignment electrodes ALE1 and ALE2. Here, a case where the light emitting elements LD are disposed between the first and second alignment electrodes ALE1 and ALE2 may mean that at least a portion of each of the light emitting elements LD is disposed in an area between the first and second alignment electrodes ALE1 and ALE2.

The first ends EP1 of the light emitting elements LD may be disposed adjacent to the first alignment electrode ALE1 (for example, disposed toward the first alignment electrode ALE1), and may or may not overlap the first alignment electrode ALE1. The first ends EP1 of the light emitting elements LD may overlap the first electrode ELT1 and may be electrically connected to the first electrode ELT1.

The second ends EP2 of the light emitting elements LD may be disposed adjacent to the second alignment electrode ALE2 (for example, disposed toward the second alignment electrode ALE2), and may or may not overlap the second alignment electrode ALE2. The second ends EP2 of the light emitting elements LD may overlap the second electrode ELT2 and may be electrically connected to the second electrode ELT2.

In one or more embodiments, each light emitting element LD may be an inorganic light emitting element using a material of an inorganic crystalline structure and having an ultra-small size (for example, a small size of a range of nanometer to micrometer). For example, each light emitting element LD may be an ultra-small inorganic light emitting element manufactured by growing and etching a nitride-based semiconductor in a rod shape (for example, the light emitting element LD according to the embodiment of FIGS. 1 and 2). However, the type, size, shape, structure, number, and/or the like of the light emitting element(s) LD configuring each light emitting unit EMU may be changed.

The light emitting elements LD may be prepared in a dispersed form in a solution, and may be supplied to the emission area EA of each sub-pixel SPX through an inkjet method, a slit coating method, or the like. When the first and second alignment signals are applied to the first and second alignment electrodes ALE1 and ALE2 (or the first and second alignment lines) of the sub-pixels SPX concurrently (e.g., simultaneously) with or after the supply of the light emitting elements LD, an electric field may be formed between the first and second alignment electrodes ALE1 and ALE2, and thus the light emitting elements LD are aligned.

After the light emitting elements LD are aligned, a solvent may be removed through a drying process or the like.

The first electrode ELT1 may be disposed on the first alignment electrode ALE1 and the first ends EP1 of the light emitting elements LD. In one or more embodiments, the first electrode ELT1 may be electrically connected to the first alignment electrode ALE1 through the first contact portion CNT1. In addition, the first electrode ELT1 may be disposed on the first ends EP1 of the light emitting elements LD and may be electrically connected to the first ends EP1 of the light emitting elements LD. For example, the first electrode ELT1 may be directly disposed on the first ends EP1 to be in contact with the first ends EP1 of the light emitting elements LD.

The second electrode ELT2 may be disposed on the second alignment electrode ALE2 and second ends EP2 of the light emitting elements LD. In one or more embodiments, the second electrode ELT2 may be electrically connected to the second alignment electrode ALE2 through the second contact portion CNT2. In addition, the second electrode ELT2 may be disposed on the second ends EP2 of the light emitting elements LD and may be electrically connected to the second ends EP2. For example, the second electrode ELT2 may be directly disposed on the second ends EP2 to be in contact with the second ends EP2 of the light emitting elements LD.

The first and second electrodes ELT1 and ELT2 may be formed in at least the emission area EA. In one or more embodiments, the first and second electrodes ELT1 and ELT2 may extend from the emission area EA to the non-emission area NEA. For example, when the first and second electrodes ELT1 and ELT2 are connected to the first and second alignment electrodes ALE1 and ALE2 through the first and second contact portions CNT1 and CNT2 formed in the non-emission area NEA, the first and second electrodes ELT1 and ELT2 may extend to the non-emission area NEA.

Referring to FIGS. 3 to 8, the sub-pixel SPX may include a plurality of second alignment electrodes ALE2 disposed on both sides of the first alignment electrode ALE1. For example, the first alignment electrode ALE1 may be disposed in a center (or central region) of the emission area EA, and two second alignment electrodes ALE2 may be disposed on both sides of the first alignment electrode ALE1. Each second wall pattern WP2 may be disposed under each of the second alignment electrodes ALE2.

In addition, the sub-pixel SPX may further include an intermediate electrode IET connected between the first electrode ELT1 and the second electrode ELT2 through the light emitting elements LD. The light emitting elements LD may further include first light emitting elements LD1 connected between the first electrode ELT1 and the intermediate electrode IET, and second light emitting elements LD2 connected between the intermediate electrode IET and the second electrode ELT2.

The intermediate electrode IET may overlap a portion of each of the first and second alignment electrodes ALE1 and ALE2. For example, a portion of the intermediate electrode IET may overlap a portion of the first alignment electrode ALE1, and another portion of the intermediate electrode IET may overlap any one of the second alignment electrodes ALE2. The first electrode ELT1 may overlap another portion of the first alignment electrode ALE1 and may be spaced from the intermediate electrode IET in the second direction DR2 and the first direction DR1. The second electrode ELT2 may overlap another second alignment electrode ALE2 and may be spaced from the first electrode ELT1 and the intermediate electrode IET in the second direction DR2.

The first electrode ELT1 may be disposed on the first ends EP1 of the first light emitting elements LD1 and may be connected to the first ends EP1 of the first light emitting elements LD1. In one or more embodiments, the first electrode ELT1 may be connected to the first alignment electrode ALE1 through the first contact portion CNT1. The first alignment electrode ALE1 may be connected to the pixel circuit PXC through the third contact portion CNT3.

The intermediate electrode IET may be disposed on the second ends EP2 of the first light emitting elements LD1 and the first ends EP1 of the second light emitting elements LD2, and may be connected to the second ends EP2 of the first light emitting elements LD1 and the first ends EP1 of the second light emitting elements LD2. The intermediate electrode IET may not be directly connected to the first and second alignment electrodes ALE1 and ALE2. For example, at least one insulating layer may be disposed between the intermediate electrode IET and the first and second alignment electrodes ALE1 and ALE2, and the intermediate electrode IET and the first and second alignment electrodes ALE1 and ALE2 may be separated from each other by the insulating layer. The second ends EP2 of the first light emitting elements LD1 may be connected to the first ends EP1 of the second light emitting elements LD2 by the intermediate electrode IET.

The second electrode ELT2 may be disposed on the second ends EP2 of the second light emitting elements LD2 and may be connected to the second ends EP2 of the second light emitting elements LD2. In one or more embodiments, the second electrode ELT2 may be connected to any one second alignment electrode ALE2 through the second contact portion CNT2. Each second alignment electrode ALE2 may be connected to the second power line PL2 through the fourth contact portion CNT4.

In one or more embodiments, the first, second, third, and/or fourth contact portions CNT1, CNT2, CNT3, and/or CNT4 may be disposed to be adjacent to each other or may be disposed so as not to be adjacent to each other. For example, as shown in FIG. 7, the first, second, third, and fourth contact portions CNT1, CNT2, CNT3, and CNT4 may be positioned to be adjacent to each other in an upper area (or a lower area) of the emission area EA. Alternatively, as shown in FIG. 8, at least one of the first, second, third, and fourth contact portions CNT1, CNT2, CNT3, and CNT4 (for example, the first, second, and third contact portions CNT1, CNT2, and CNT3) may be positioned in the upper area of the emission area EA, and the remaining contact portion (for example, the fourth contact portion CNT4) may be positioned in the lower area of the emission area EA. A size and a position of the first, second, third, and/or fourth contact portions CNT1, CNT2, CNT3, and/or CNT4 may be variously changed according to one or more embodiments.

The first bank BNK1 may be disposed in the non-emission area NEA around the emission area EA to be around (or surround) the emission area EA of each of the sub-pixels SPX. For example, the first bank BNK1 may be disposed in an outer area of each of the sub-pixels SPX and/or in an area between adjacent sub-pixels SPX to be around (or surround) each emission area EA.

The first bank BNK1 may include openings corresponding to the emission areas EA of the sub-pixels SPX. In addition, the first bank BNK1 may further include the openings OPA corresponding to the separation areas. For example, the first bank BNK1 may be opened corresponding to the emission areas EA and the separation areas and may have a mesh shape, generally in the display area DA. As the first bank BNK1 includes the openings OPA corresponding to the separate areas, the first and second alignment lines (or the first alignment line) may be easily separated into the first and second alignment electrodes ALE1 and ALE2 (or the first alignment electrodes ALE1) after alignment of the light emitting elements LD is completed.

The first bank BNK1 may include at least one light blocking and/or reflective material. For example, the first bank BNK1 may include at least one black matrix material, a color filter material of a specific color, and/or the like. Accordingly, light leakage between adjacent sub-pixels SPX may be prevented or reduced.

In addition, in a step of supplying the light emitting elements LD to each sub-pixel SPX, the first bank BNK1 may define each emission area EA to which the light emitting elements LD are to be supplied. For example, as the emission areas EA of the sub-pixels SPX are separated and partitioned by the first bank BNK1, a desired type and/or amount of light emitting diode ink (for example, a solution including at least one type of light emitting elements LD) may be supplied.

Figure 9:
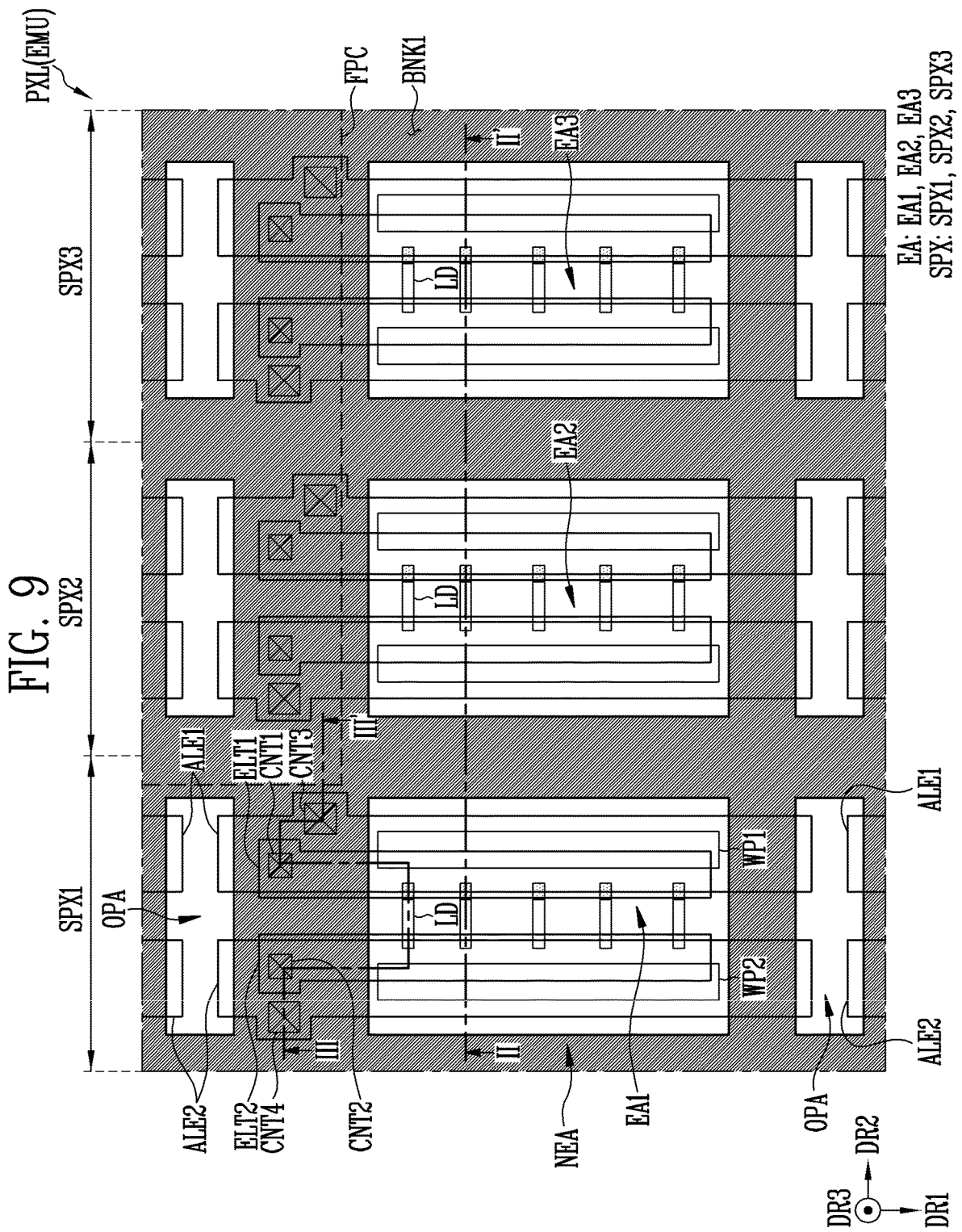
FIG. 9 is a plan view illustrating a pixel according to one or more embodiments of the present disclosure.

FIG. 9 is a plan view illustrating a pixel PXL according to one or more embodiments of the present disclosure. For example, FIG. 9 shows the light emitting units EMU of the pixel PXL including the first, second, and third sub-pixels SPX1, SPX2, and SPX3 each including the light emitting unit EMU of a parallel structure as in the embodiment of FIG. 7.

Referring to FIGS. 3 to 9, each pixel PXL may include a plurality of sub-pixels SPX disposed adjacent to each other. For example, the pixel PXL may include the first, second, and third sub-pixels SPX1, SPX2, and SPX3 for emitting light of different colors.

Each sub-pixel SPX may include the emission area EA in which at least one light emitting element LD is disposed. For example, the first sub-pixel SPX1 may include a first emission area EA1 in which a plurality of light emitting elements LD are disposed. The second sub-pixel SPX2 may include a second emission area EA2 in which a plurality of light emitting elements LD are disposed, and the third sub-pixel SPX3 may include a third emission area EA3 in which a plurality of light emitting elements LD are disposed.

In one or more embodiments, the emission areas EA of the first, second, and third sub-pixels SPX1, SPX2, and SPX3 may be sequentially disposed along the second direction DR2, but the present disclosure is not limited thereto. The emission areas EA may be partitioned by the first bank BNK1.

In one or more embodiments, the first, second, and third sub-pixels SPX1, SPX2, and SPX3 may have structures substantially similar to or the same as each other. Accordingly, in FIG. 9, only the first and second wall patterns WP1 and WP2, the first and second alignment electrodes ALE1 and ALE2, the first and second electrodes ELT1 and ELT2, and the first to fourth contact portions CNT1 to CNT4 of the first sub-pixel SPX1 are denoted by reference numerals. Because the structure of each sub-pixel SPX is described in detail through the embodiment of FIG. 7 or the like, a detailed description thereof is omitted.

In one or more embodiments, at least one pixel PXL and/or sub-pixel SPX disposed in the display area DA may overlap the circuit board FPC. For example, the circuit board FPC may be disposed on one surface of the display panel DP to overlap at least some of the pixels PXL and the sub-pixels SPX configuring the same, and the pads (for example, pads PD of FIG. 12) for electrically connecting the power lines and/or the signal lines of the display panel DP to the bonding pads (for example, bonding pads BDP of FIG. 12) of the circuit board FPC may be formed on one surface of the display panel DP. At least one of the pads may be formed in the display area DA to overlap at least one pixel PXL (or sub-pixel SPX). However, positions of the circuit board FPC and the pads may be variously changed according to one or more embodiments.

In the embodiment of FIG. 9, an embodiment in which the non-emission area NEA of at least one pixel PXL (or sub-pixel SPX) overlaps a portion of the circuit board FPC is shown. However, the present disclosure is not limited thereto. For example, the circuit board FPC may be disposed on the display panel DP to overlap the emission area EA and/or the non-emission area NEA of at least one pixel PXL (or sub-pixel SPX).

In one or more embodiments, the circuit board FPC and/or the pads may be disposed only in the non-emission area NA (for example, the non-emission area NA positioned at an edge area of the display panel DP as shown in FIG. 3) so as not to overlap the pixels PXL.

Figure 10:
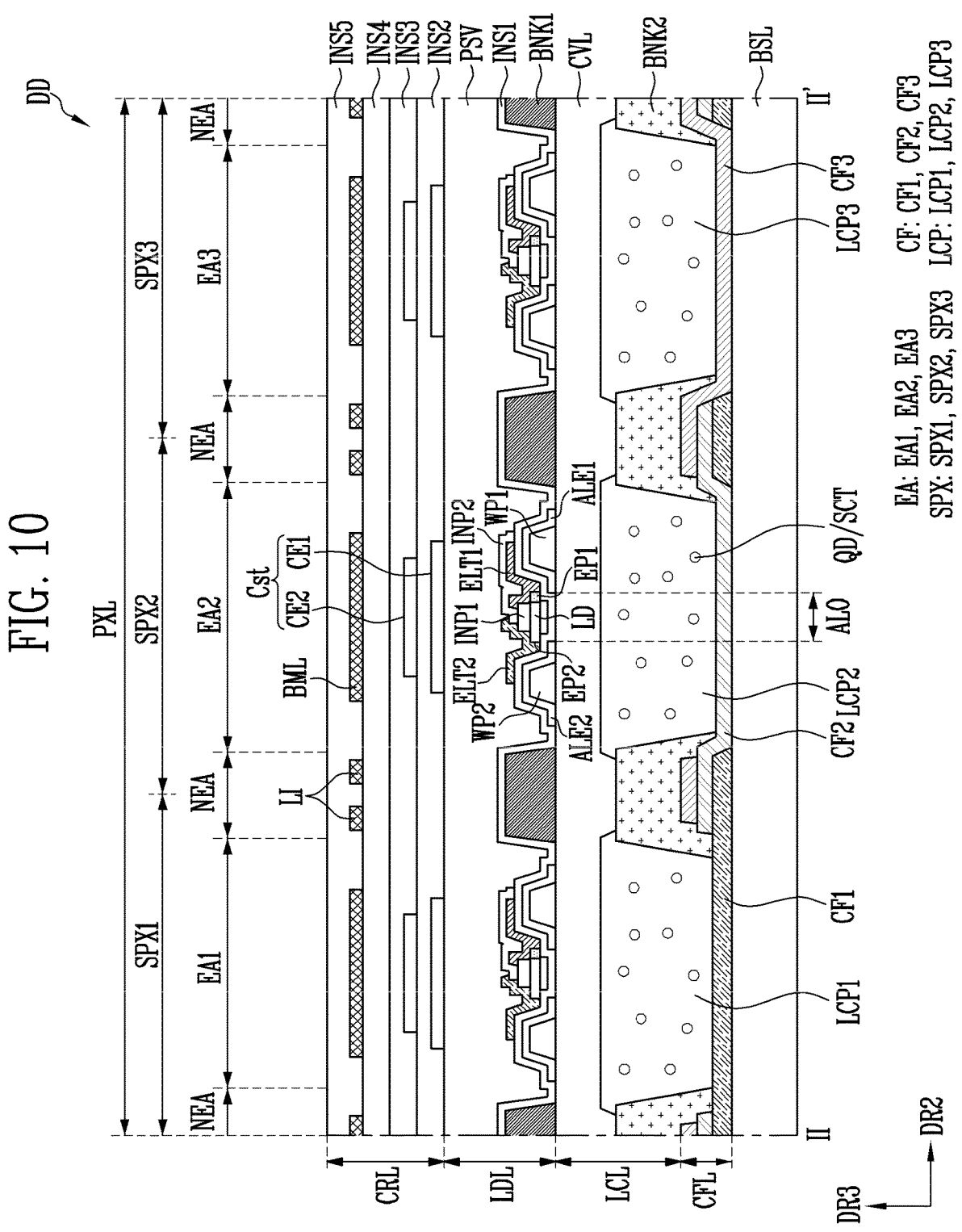
FIGS. 10 to 12 are cross-sectional views illustrating a pixel and a display device including the same according to one or more embodiments of the present disclosure.
Figure 11:
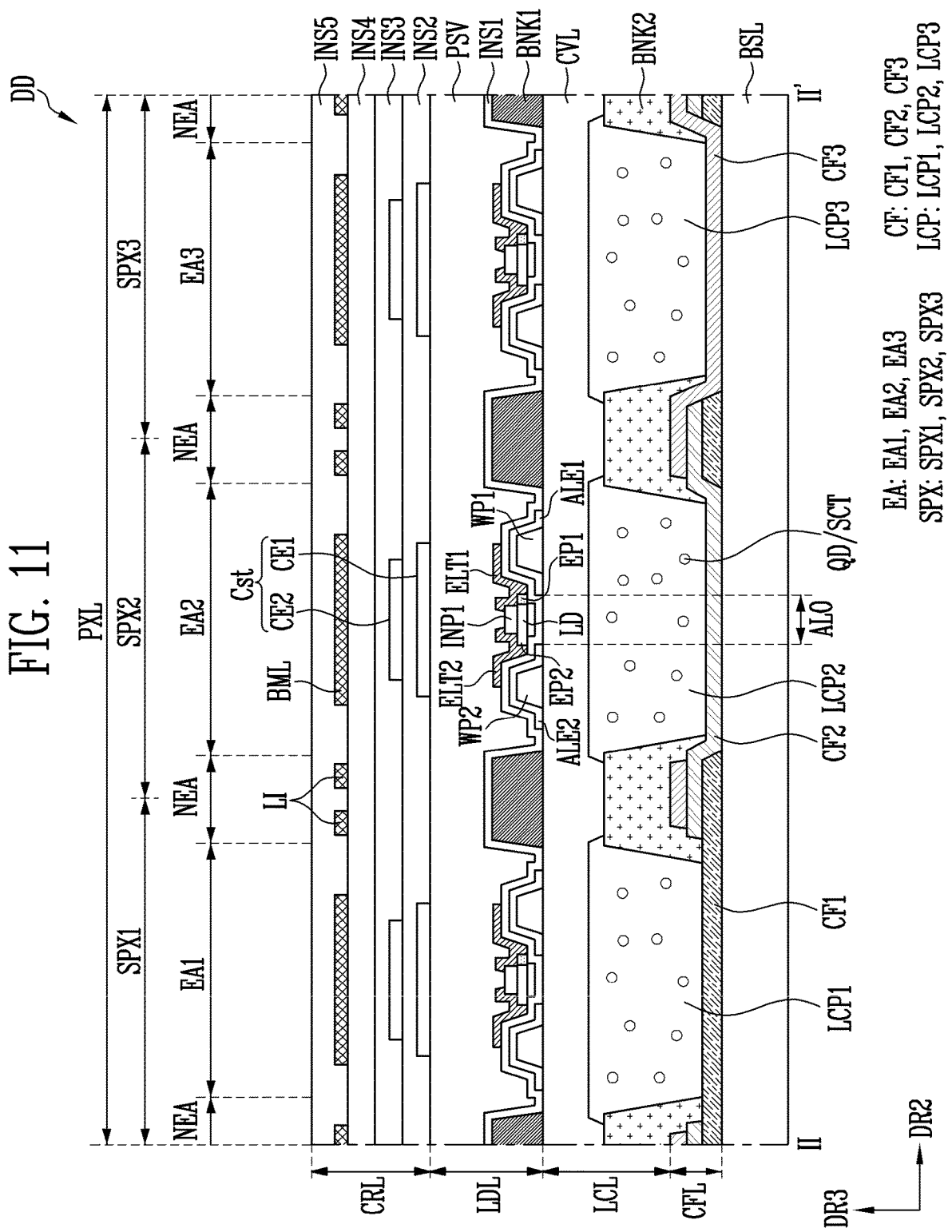
Figure 12:
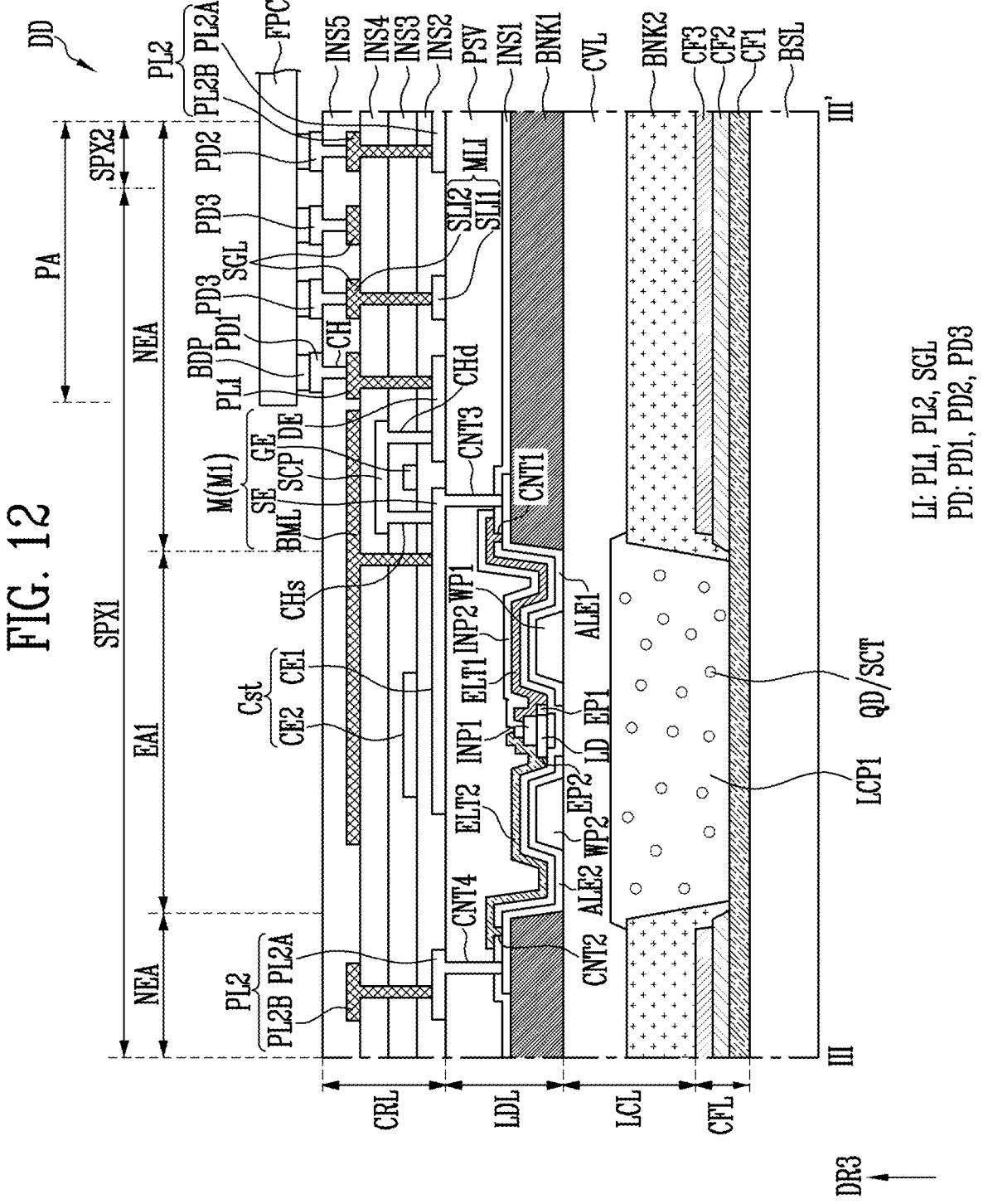

FIGS. 10 to 12 are cross-sectional views illustrating a pixel PXL and a display device DD including the same according to one or more embodiments of the present disclosure. For example, FIGS. 10 and 11 illustrate cross-sections of the display device DD corresponding to a cross-section of the pixel PXL taken along the line II-II' of FIG. 9, and FIG. 12 illustrates a cross-section of the display device DD corresponding to a cross-section of the pixel PXL taken along the line III-III' of FIG. 9.

FIGS. 10 and 11 illustrate different embodiments in relation to the first and second electrodes ELT1 and ELT2. For example, FIG. 10 illustrates an embodiment in which the first and second electrodes ELT1 and ELT2 provided in each emission area EA are disposed on different layers, and FIG. 11 illustrates an embodiment in which the first and second electrodes ELT1 and ELT2 are disposed on the same layer.

FIG. 12 illustrates the cross-section of the display device DD including an area (for example, an area including a peripheral area of the third contact portion CNT3 of the first sub-pixel SPX1) of the pixel PXL overlapping the pad area PA. Accordingly, FIG. 12 shows a cross-section of the pad area PA together with a cross-section of the pixel PXL. For example, in one or more embodiments of the present disclosure, at least one pixel PXL disposed in the display area DA may overlap the pad area PA and the circuit board FPC disposed and/or bonded on the pad area PA.

Referring to FIGS. 3 to 12, the display device DD may include the base layer BSL, and the color filter layer CFL, the light emitting element layer LDL, and the circuit layer CRL sequentially disposed on the base layer BSL. In addition, the display device DD may selectively further include the light conversion layer LCL disposed between the color filter layer CFL and the light emitting element layer LDL. The color filter layer CFL, the light conversion layer LCL, the light emitting element layer LDL, and the circuit layer CRL may configure the display panel DP. In addition, the display panel DP may further include the pads PD disposed on the circuit layer CRL.

The display device DD may further include the circuit board FPC disposed on the circuit layer CRL and connected to the display panel DP through the pads PD. The circuit board FPC may overlap the display panel DP at least in the pad area PA. In one or more embodiments, the pad area PA may overlap the display area DA. For example, the pad area PA may overlap at least one pixel PXL (or sub-pixel SPX). In this case, the circuit board FPC may overlap at least one pixel PXL (or sub-pixel SPX).

The base layer BSL may be a rigid substrate, or a flexible substrate or film, and a material or a structure thereof is not particularly limited. For example, the base layer BSL may include at least one transparent or opaque insulating material, and may be a substrate or a film of a single layer or multiple layers. For example, the base layer BSL may be a substrate of a single layer or multiple layers including at least one polyimide (PI) film, but is not limited thereto.

The color filter layer CFL may be disposed on one surface of the base layer BSL. For example, the color filter layer CFL may be disposed on a front surface (or an upper surface) of the base layer BSL and may be provided in the display area DA.

The color filter layer CFL may include color filters CF corresponding to the colors of the sub-pixels SPX. For example, the color filter layer CFL may include a first color filter CF1 disposed in the first emission area EA1, a second color filter CF2 disposed in the second emission area EA2, and a third color filter CF3 disposed in the third emission area EA3. For example, when the first sub-pixel SPX1, the second sub-pixel SPX2, and the third sub-pixel SPX3 are a blue sub-pixel, a green sub-pixel, and a red sub-pixel, respectively, the first color filter CF1 of blue, the second color filter CF2 of green, and the third color filter CF3 of red may be disposed in the first emission area EA1, the second emission area EA2, and the third emission area EA3, respectively.

In one or more embodiments, the first, second, and third color filters CF1, CF2, and CF3 may overlap each other in the non-emission area NEA to block light leakage. Alternatively, the first, second, and third color filters CF1, CF2, and CF3 may be formed separately from each other, and a separate light blocking pattern may also be disposed between the first, second, and third color filters CF1, CF2 and CF3.

The light conversion layer LCL may be disposed on the color filter layer CFL. For example, the light conversion layer LCL may be disposed on the front surface of the base layer BSL provided with the color filter layer CFL, and may be provided in the display area DA.

The light conversion layer LCL may include the light conversion patterns LCP corresponding to the colors of the sub-pixels SPX. For example, the light conversion layer LCL may include a first light conversion pattern LCP1 disposed in the first emission area EA1, a second light conversion pattern LCP2 disposed in the second emission area EA2, and a third light conversion pattern LCP3 disposed in the third emission area EA3.

Each light conversion pattern LCP may include at least one of at least one type of light conversion particles (for example, a quantum dot QD) and light scattering particles SCT (for example, silica). The light conversion particles (or wavelength conversion particles) may convert light of a color (or a wavelength) emitted from the light emitting elements LD provided in the emission area EA of the corresponding sub-pixel SPX into light of another color (or another wavelength).

For example, when the first sub-pixel SPX1, the second sub-pixel SPX2, and the third sub-pixel SPX3 are a blue sub-pixel, a green sub-pixel, and a red sub-pixel, respectively, and blue light emitting elements LD are disposed in the first, second, and third emission areas EA1, EA2, and EA3, the first light conversion pattern LCP1 may include the light scattering particles SCT. Accordingly, blue light emitted from the blue light emitting elements LD disposed in the first emission area EA1 may be emitted more efficiently. The second light conversion pattern LCP2 and the third light conversion pattern LCP3 may include green and red quantum dots QD, respectively, and may selectively further include the light scattering particles SCT. The green quantum dot QD provided in the second emission area EA2 may convert the blue light emitted from the blue light emitting elements LD disposed in the second emission area EA2 into green light. The red quantum dot QD provided in the third emission area EA3 may convert the blue light emitted from the blue light emitting elements LD disposed in the third emission area EA3 into red light. Accordingly, the first sub-pixel SPX1, the second sub-pixel SPX2, and the third sub-pixel SPX3 may emit the blue light, the green light, and the red light, respectively.

In addition, the light conversion layer LCL may further include a second bank BNK2 and a cover layer CVL.

The second bank BNK2 may be disposed in the non-emission area NEA to be around (or surround) each light conversion pattern LCP, and may overlap the first bank BNK1 in the third direction DR3. The second bank BNK2 may define (or partition) each emission area EA in which the light conversion patterns LCP are to be formed.

The second bank BNK2 may include a light blocking and/or reflective material including a black matrix material or the like. Accordingly, light leakage between the sub-pixels SPX may be prevented or reduced. The second bank BNK2 may include a material identical to or different from that of the first bank BNK1.

The cover layer CVL may be disposed on the light conversion layer LCL to cover the light conversion patterns LCP and the second bank BNK2. The cover layer CVL may include at least one organic insulating layer and/or inorganic insulating layer, and may protect the light conversion patterns LCP. In one or more embodiments, the cover layer CVL may include a low refractive index material. For example, the cover layer CVL may include a low refractive material (for example, silicon oxide ($SiO_x$)) having a refractive index of about 1.4 to 1.6, but is not limited thereto.

The light emitting element layer LDL may be disposed on the light conversion layer LCL. For example, the light emitting element layer LDL may be disposed on the front surface of the base layer BSL on which the color filter layer CFL and the light conversion layer LCL are provided, and may be provided in the display area DA.

The light emitting element layer LDL may include the first and second wall patterns WP1 and WP2, the first bank BNK1, the first and second alignment electrodes ALE1 and ALE2, a first insulating layer INS1, the light emitting elements LD, first insulating patterns INP1, the first and second electrodes ELT1 and ELT2, and a passivation layer PSV. In one or more embodiments, the first and second wall patterns WP1 and WP2, the first bank BNK1, the first and second alignment electrodes ALE1 and ALE2, the first insulating layer INS1, the light emitting element LD, the first insulating patterns INP1, the first and second electrodes ELT1 and ELT2, and the passivation layer PSV may be sequentially disposed and/or formed on one surface of the base layer BSL on which the color filter layer CFL and/or the light conversion layer LCL are provided. However, a disposition order thereof may be changed according to one or more embodiments. For example, in one or more embodiments, after the first and second wall patterns WP1 and WP2, the first and second alignment electrodes ALE1 and ALE2, and the first insulating layer INS1 are sequentially formed, the first bank BNK1 may be formed on the first insulating layer INS1. The light emitting element layer LDL may further selectively include second insulating patterns INP2 shown in FIGS. 10 and 12.

The first and second wall patterns WP1 and WP2 may be disposed under the first and second alignment electrodes ALE1 and ALE2 to respectively overlap the first and second alignment electrodes ALE1 and ALE2 in the third direction DR3. The first and second alignment electrodes ALE1 and ALE2 may protrude in an upper direction (for example, the third direction DR3) around the light emitting elements LD by the first and second wall patterns WP1 and WP2.

For example, in each emission area EA, the first wall pattern WP1 may be disposed under a portion of the first alignment electrode ALE1, and may protrude the portion of the first alignment electrode ALE1 upward around the first ends EP1 of the light emitting elements LD. Similarly, in each emission area EA, the second wall pattern WP2 may be disposed under a portion of the second alignment electrode ALE2, and may protrude the portion of the second alignment electrode ALE2 upward around the second ends EP2 of the light emitting elements LD.

In one or more embodiments, the first and second wall patterns WP1 and WP2 may be individually separated separation type patterns, but are not limited thereto. For example, the first and second wall patterns WP1 and WP2 may be formed in an integrated pattern connected to each other and having an opening or a concave portion corresponding to areas (for example, each light emitting element arrangement area) between the first and second alignment electrodes ALE1 and ALE2 in each emission area EA. In this case, the first and second wall patterns WP1 and WP2 may be formed in an integrated pattern connected to each other in each sub-pixel SPX or pixel PXL or connected entirely in the display area DA.

The first and second wall patterns WP1 and WP2 may include an inorganic insulating layer and/or an organic insulating layer. In addition, the first and second wall patterns WP1 and WP2 may be formed of a single layer or multiple layers.

The first bank BNK1 may define (or partition) each emission area EA to which the light emitting elements LD are to be supplied. For example, the light emitting elements LD may be supplied to each emission area EA surrounded by the first bank BNK1.

The first and second alignment electrodes ALE1 and ALE2 may be disposed on both sides of the light emitting elements LD. For example, in each emission area EA, the first alignment electrode ALE1 may be disposed around the light emitting elements LD to be adjacent to the first ends EP1 of the light emitting elements LD, and may be disposed under the first electrode ELT1. Similarly, in each emission area EA, the second alignment electrode ALE2 may be disposed around the light emitting elements LD to be adjacent to the second ends EP2 of the light emitting elements LD, and may be disposed under the second electrode ELT2.

Each of the first and second alignment electrodes ALE1 and ALE2 may be formed of a single layer or multiple layers. Each of the first and second alignment electrodes ALE1 and ALE2 may have conductivity by including at least one conductive material.

In one or more embodiments, the display device DD may be a rear surface light emission type display device in which the pixels PXL (or the sub-pixels SPX) emit light in a direction in which the base layer BSL is positioned (for example, a rear direction of the display panel DP). In addition, each of the first and second alignment electrodes ALE1 and ALE2 may include a transparent conductive material. For example, each of the first and second alignment electrodes ALE1 and ALE2 may include at least one transparent electrode layer including transparent conductive material such as indium tin oxide (ITO), indium zinc oxide (IZO), indium tin zinc oxide (ITZO), zinc oxide (ZnO), or indium oxide ($In_xO_y$), and may be substantially transparent. In this case, light output efficiency (for example, a rear surface light output rate) of light generated in each sub-pixel SPX may be increased.

In one or more embodiments, in each emission area EA, an area (for example, ALO of FIGS. 10 and 11) between the first and second alignment electrodes ALE1 and ALE2 may be disposed to correspond to a center portion of the light conversion pattern LCP. For example, in the first direction DR1, the area ALO (or a center thereof) between the first and second alignment electrodes ALE1 and ALE2 may be positioned at a center of the corresponding emission area EA, and may substantially coincide with a center of the light conversion pattern LCP. For example, the center of the area ALO between the first and second alignment electrodes ALE1 and ALE2 in the first direction DR1 and the center of the light conversion pattern LCP in the first direction DR1 may be positioned on a line extending in the third direction DR3, and may have the same X coordinate value (or the same X coordinate value and/or the same Y coordinate value). Accordingly, light emitting efficiency of the sub-pixels SPX may be increased.

The first insulating layer INS1 may be disposed on the first and second alignment electrodes ALE1 and ALE2. For example, the first insulating layer INS1 may cover the first and second alignment electrodes ALE1 and ALE2, and may be provided in the display area DA so as to be disposed between the first alignment electrode ALE1 and the first electrode ELT1 corresponding to each other and between the second alignment electrode ALE2 and the second electrode ELT2 corresponding to each other.

The first insulating layer INS1 may be formed of a single layer or multiple layers, and may include at least one inorganic insulating material and/or organic insulating material. In one or more embodiments, the first insulating layer INS1 may include at least one type of inorganic insulating material including silicon nitride ($SiN_x$), silicon oxide ($SiO_x$), or silicon oxynitride ($SiO_xN_y$).

As the first and second alignment electrodes ALE1 and ALE2 are covered by the first insulating layer INS1, the first and second alignment electrodes ALE1 and ALE2 may be prevented from being damaged in a subsequent process. In addition, a short defect due to an improper connection between the first and second alignment electrodes ALE1 and ALE2 and the light emitting elements LD may be prevented from occurring.

The light emitting elements LD may be disposed on the first insulating layer INS1 and may be disposed between the first and second alignment electrodes ALE1 and ALE2. For example, the light emitting elements LD may be disposed between the first and second alignment electrodes ALE1 and ALE2 so that each of the first ends EP1 is adjacent to the first alignment electrode ALE1 and each of the second ends EP2 is adjacent to the second alignment electrode ALE2.

The first insulating patterns INP1 (also referred to as a "sixth insulating layer") may be disposed on a portion of the light emitting elements LD. For example, in each emission area EA, the first insulating pattern INP1 may be locally disposed on a portion including a central portion of the light emitting elements LD to expose the first and second ends EP1 and EP2 of the light emitting elements LD. When the first insulating patterns INP1 are formed on the light emitting elements LD, the light emitting elements LD may be stably fixed and the first and second electrodes ELT1 and ELT2 maybe stably separated.

The first insulating patterns INP1 may be formed of a single layer or multiple layers, and may include at least one inorganic insulating material and/or organic insulating material. For example, the first insulating patterns INP1 may include various types of organic/inorganic insulating materials including silicon nitride ($SiN_x$), silicon oxide ($SiO_x$), silicon oxynitride ($SiO_xN_y$), aluminum oxide ($Al_xO_y$), photoresist (PR) material, and the like.

The first electrodes ELT1 may be disposed on the first ends EP1 of the light emitting elements LD. For example, in each emission area EA, the first electrode ELT1 may be disposed on the first ends EP1 of the light emitting elements LD, and may be electrically connected to the first ends EP1.

In one or more embodiments, respective first electrodes ELT1 may be connected to respective first alignment electrodes ALE1 through respective first contact portions CNT1. In one or more embodiments, each first contact portion CNT1 may be formed by passing through the first insulating layer INS1 in the non-emission area NEA, and may connect the first electrode ELT1 and the first alignment electrode ALE1 of the corresponding sub-pixel SPX.

The second electrodes ELT2 may be disposed on the second ends EP2 of the light emitting elements LD. For example, in each emission area EA, the second electrode ELT2 may be disposed on the second ends EP2 of the light emitting elements LD, and may be electrically connected to the second ends EP2.

In one or more embodiments, respective second electrodes ELT2 may be connected to respective second alignment electrodes ALE2 through respective second contact portions CNT2. In one or more embodiments, each second contact portion CNT2 may be formed by passing through the first insulating layer INS1 in the non-emission area NEA, and may connect the second electrode ELT2 and the second alignment electrode ALE2 of the corresponding sub-pixel SPX.

Each of the first and second electrodes ELT1 and ELT2 may be formed of a single layer or multiple layers. Each of the first and second electrodes ELT1 and ELT2 may have conductivity by including at least one conductive material.

In one or more embodiments, the display device DD may be a rear surface light emission type display device in which the pixels PXL (or the sub-pixels SPX) emit light in a direction in which the base layer BSL is positioned (for example, a rear direction of the display panel DP). In addition, each of the first and second electrodes ELT1 and ELT2 may include a reflective conductive material. Accordingly, the light output efficiency (for example, the rear surface light output rate) of the light generated in each sub-pixel SPX may be increased.

In one or more embodiments, each of the first and second electrodes ELT1 and ELT2 may include a metal layer of a single layer or multiple layers including at least one type of metal or an alloy. For example, each of the first and second electrodes ELT1 and ELT2 may include a metal having a high reflectance in a visible light wavelength band, for example, at least one layer of metal layer including at least one of various metal materials including aluminum (Al), gold (Au), and silver (Ag).

In one or more embodiments, each of the first and second electrodes ELT1 and ELT2 may have a thickness sufficient to secure a suitable reflectance (e.g., a reflectance of a predetermined range). For example, a sufficient reflectance may be secured by forming each of the first and second electrodes ELT1 and ELT2 in a thickness of 40 nm or more.

In one or more embodiments, the light emitting element layer LDL may further include second insulating patterns INP2 (or also referred to as a "seventh insulating layer") disposed between the first and second electrodes ELT1 and ELT2 as shown in FIGS. 10 and 12. For example, in each emission area EA, the second insulating pattern INP2 may be formed to cover the first electrode ELT1 (or the second electrode ELT2), and one end of the second electrode ELT2 (or the first electrode ELT1) may be disposed on a portion of the second insulating pattern INP2.

In one or more embodiments, the first and second electrodes ELT1 and ELT2 may be disposed on (or at) the same layer as shown in FIG. 11. In this case, the light emitting element layer LDL may not include the second insulating patterns INP2.

The passivation layer PSV may be disposed on the light emitting element layer LDL to cover the light emitting elements LD, the first and second electrodes ELT1 and ELT2, and the like. For example, the passivation layer PSV may be entirely formed in the display area DA.

The passivation layer PSV may include at least one organic and/or inorganic insulating layer. In one or more embodiments, the passivation layer PSV may include at least one organic insulating layer, and may substantially planarize a surface of the light emitting element layer LDL.

The circuit layer CRL may be disposed on the light emitting element layer LDL. For example, the circuit layer CRL may be disposed on the front surface of the base layer BSL on which the color filter layer CFL, the light conversion layer LCL, and/or the light emitting element layer LDL are sequentially disposed, and may be provided in the display area DA.

The circuit layer CRL may include circuit elements and lines LI connected to each of the first electrode ELT1 and the second electrode ELT2. For example, the circuit layer CRL may include the circuit elements (for example, the transistors M and the capacitors Cst) configuring the pixel circuit PXC of each of the sub-pixels SPX, and the lines LI connected to the circuit elements and/or the light emitting units EMU of the sub-pixels SPX. The lines LI may include power lines including the first and second power lines PL1 and PL2, and signal lines SGL including the scan lines SL, the data lines DL, the control lines SSL, and/or the sensing lines SENL.

FIGS. 10 to 12 show any one transistor (for example, the first transistor M1 including the bottom metal layer BML) and the capacitor Cst provided in any one first sub-pixel SPX1 as an example of the circuit elements that may be disposed in the circuit layer CRL, and show the first power line PL1 connected to the first transistors M1 of the sub-pixels SPX and the second power line PL2 connected to the second electrodes ELT2 of the sub-pixels SPX as an example of the lines LI that may be disposed in the circuit layer CRL. In one or more embodiments, at least one (for example, the second power line PL2) of the first power line PL1 and the second power line PL2 may be disposed in a mesh shape in the display area DA.

The circuit layer CRL may include a first conductive layer, a second insulating layer INS2, a second conductive layer, a third insulating layer INS3, a semiconductor layer, a fourth insulating layer INS4, a third conductive layer, and a fifth insulating layer INS5 sequentially disposed on the light emitting element layer LDL.

The first conductive layer may include source electrodes SE and drain electrodes DE of the transistors M. Each source electrode SE may be connected to one region (for example, a source region) of the semiconductor pattern SCP included in the corresponding transistor M through at least one contact hole CHs, and each drain electrode DE may be connected to another region (for example, a drain region) of the semiconductor pattern SCP included in the corresponding transistor M through at least another contact hole CHd. Although in FIG. 12 the contact holes CHs and CHd for connecting each of the source electrode SE and the drain electrode DE to the semiconductor pattern SCP are filled with the same material as the semiconductor pattern SCP, the present disclosure is not limited thereto. For example, the contact holes CHs and CHd may be filled with a conductive material (for example, a metal) having higher conductivity.

The first transistors M1 of the sub-pixels SPX may be connected between the first power line PL1 and the first alignment electrode ALE1 of the corresponding sub-pixel SPX. For example, the drain electrodes DE of the first transistors M1 may be commonly connected to the first power line PL1, and the source electrode SE of each of the first transistors M1 may be connected to the first alignment electrode ALE1 of the corresponding sub-pixel SPX.

In one or more embodiments, the source electrode SE of each of the first transistors M1 may be connected to the first alignment electrode ALE1 of the corresponding sub-pixel SPX through each third contact portion CNT3. In one or more embodiments, each third contact portion CNT3 may be formed by passing through the first insulating layer INS1 and the passivation layer PSV in the non-emission area NEA, and may connect the first alignment electrode ALE1 and the first transistor M1 of the corresponding sub-pixel SPX.

In addition, the first conductive layer may include one electrode of each of the capacitors Cst included in the pixel circuits PXC, at least some signal lines SGL, and/or at least one power line. For example, the first conductive layer may include a first electrode CE1 of each of the capacitors Cst and the signal lines SGL (for example, the scan lines SL and/or the control lines SSL) extending in the second direction DR2 in the display area DA. In addition, when the second power line PL2 is a line of multiple layers and/or a mesh shape including first sub-lines PL2A extending in the second direction DR2 in the display area DA and second sub-lines PL2B extending in the first direction DR1 in the display area DA, the first conductive layer may further include the first sub-lines PL2A. Similarly, when at least one signal line SGL is a line MLI of multiple layers including each of a first sub-line SLI1 and a second sub-line SLI2, the first conductive layer may further include the first sub-line SLI1.

In one or more embodiments, the second power line PL2 may be connected to the second alignment electrodes ALE2 through each fourth contact portion CNT4. For example, the first sub-lines PL2A of the second power line PL2 may be disposed in the display area DA in at least one pixel row (or pixel column) unit, and may be connected to the second alignment electrodes ALE2 of the sub-pixels SPX arranged in at least one pixel row (or pixel column) through each fourth contact portion CNT4. In one or more embodiments, each fourth contact portion CNT4 may be formed by passing through the first insulating layer INS1 and the passivation layer PSV in the non-emission area NEA, and may connect the second power line PL2 and the second alignment electrode ALE2 of the corresponding sub-pixel SPX.

The second insulating layer INS2 may be disposed on the first conductive layer. In addition, the second conductive layer may be disposed on the second insulating layer INS2. The second conductive layer may include gate electrodes GE of the transistors M. In addition, the second conductive layer may further include a second electrode CE2 of each of the capacitors Cst provided in the pixel circuits PXC, at least one line (for example, at least some signal lines SGL), bridge patterns, and/or the like. Additionally, when at least one power line and/or signal line SGL disposed in the display area DA is formed of multiple layers, the second conductive layer may selectively further include at least one sub-line configuring the at least one power line and/or signal line.

The third insulating layer INS3 may be disposed on the second conductive layer. In addition, the semiconductor layer may be disposed on the third insulating layer INS3.

The semiconductor layer may include the semiconductor patterns SCP of the transistors M. Each semiconductor pattern SCP may include a channel region overlapping the gate electrode GE of the corresponding transistor in the third direction DR3, and first and second conductive regions (for example, source and drain regions) disposed on both sides of the channel region. Each semiconductor pattern SCP may be a semiconductor pattern formed of polysilicon, amorphous silicon, an oxide semiconductor, or the like.

The fourth insulating layer INS4 may be disposed on the semiconductor layer. In addition, the third conductive layer may be disposed on the fourth insulating layer INS4.

The third conductive layer may include the bottom metal layers BML (or upper metal layers) overlapping the gate electrodes GE and the semiconductor patterns SCP of the first transistors M1 in the third direction DR3. In one or more embodiments, the bottom metal layers BML of the first transistors M1 may be connected to the source electrodes SE of the first transistors M1.

In addition, the third conductive layer may further include at least one line LI. For example, the third conductive layer may include at least one signal line SGL and/or power line extending in the first direction DR1 in the display area DA. For example, the third conductive layer may include the data lines DL, the sensing lines SENL, the second sub-line SLI2, the first power line PL1, and/or the second sub-lines PL2B of the second power line PL2. The first power line PL1 may be connected to the drain electrodes DE of the first transistors M1.

Each conductive pattern, electrode, and/or line LI configuring the first to third conductive layers may have conductivity by including at least one conductive material. For example, each conductive pattern, electrode and/or line LI configuring the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various other types of conductive materials.

The fifth insulating layer INS5 may be disposed on the third conductive layer. Each of the second insulating layer INS2, the third insulating layer INS3, the fourth insulating layer INS4, and the fifth insulating layer INS5 may be formed of a single layer or multiple layers, and may include at least one inorganic insulating material and/or organic insulating material. For example, each of the second insulating layer INS2, the third insulating layer INS3, the fourth insulating layer INS4, and the fifth insulating layer INS5 may include various types of organic/inorganic insulating materials including silicon nitride ($SiN_x$), silicon oxide ($SiO_x$), silicon oxynitride ($SiO_xN_y$), or the like.

The pads PD may be disposed on the circuit layer CRL including the fifth insulating layer INS5. For example, the pads PD may be provided in the pad area PA on the circuit layer CRL. The pad area PA may or may not overlap the display area DA.

The pads PD may include pads PD connected to the lines LI provided in the circuit layer CRL. For example, the pads PD may include a first power pad PD1 connected to the first power line PL1, a second power pad PD2 connected to the second power line PL2, and signal pads PD3 connected to different signal lines SGL.

Each of the pads PD may be connected to at least one line LI through contact holes CH passing through the fifth insulating layer INS5. For example, the pads PD may be connected to the different lines LI through respective contact holes CH.

The circuit board FPC may be disposed on the circuit layer CRL. For example, the circuit board FPC may overlap the pad area PA in which the pads PD are provided, and may be disposed on the front surface of the display panel DP in which the pads PD are provided. In one or more embodiments, when at least one area of the pad area PA is disposed in the display area DA, the circuit board FPC may be disposed on the display panel DP to overlap the display area DA.

The circuit board FPC may include the bonding pads BDP connected to the pads PD of the display panel DP. For example, the pads PD of the display panel DP and the bonding pads BDP of the circuit board FPC may be connected 1:1 through a pressing process and/or a bonding process.

The pixel PXL and the display device DD including the same according to the above-described embodiment may include the color filter layer CFL, the light conversion layer LCL, the light emitting element layer LDL, and/or the circuit layer CRL sequentially disposed and/or formed on one surface of the base layer BSL, and the first electrode ELT1 and the second electrode ELT2 including a reflective conductive material may be disposed on the first end EP1 and the second end EP2 of the light emitting element(s) LD disposed in the light emitting element layer LDL in response to the emission area EA of the pixel PXL (or the sub-pixel SPX). The pixel PXL may emit light in a rear direction in which the base layer BSL is positioned, and the display device DD may include the pads PD disposed on the circuit layer CRL.

According to the pixel PXL and the display device DD including the same, the circuit layer may be disposed to be positioned in an opposite direction of the base layer BSL in the thickness direction (for example, the third direction DR3) of the display panel DP, and the pads PD may be formed on the circuit layer CRL, to directly connect the pads PD to the circuit layer CRL. Accordingly, the pads PD may be formed on one surface (for example, the front surface) opposite to an image display surface (for example, the rear surface) of the display panel DP without forming a via hole or the like in the base layer BSL.

According to one or more embodiments of the present disclosure, the pads PD may be disposed on the display area DA of the display panel DP. Accordingly, the non-display area NA of the display device DD may be reduced. In addition, the pads PD may be connected to the lines LI of the circuit layer CRL without passing through the base layer BSL while forming the pads PD on a surface opposite to the image display surface. Accordingly, damage to the base layer BSL may be prevented.

Figure 13:
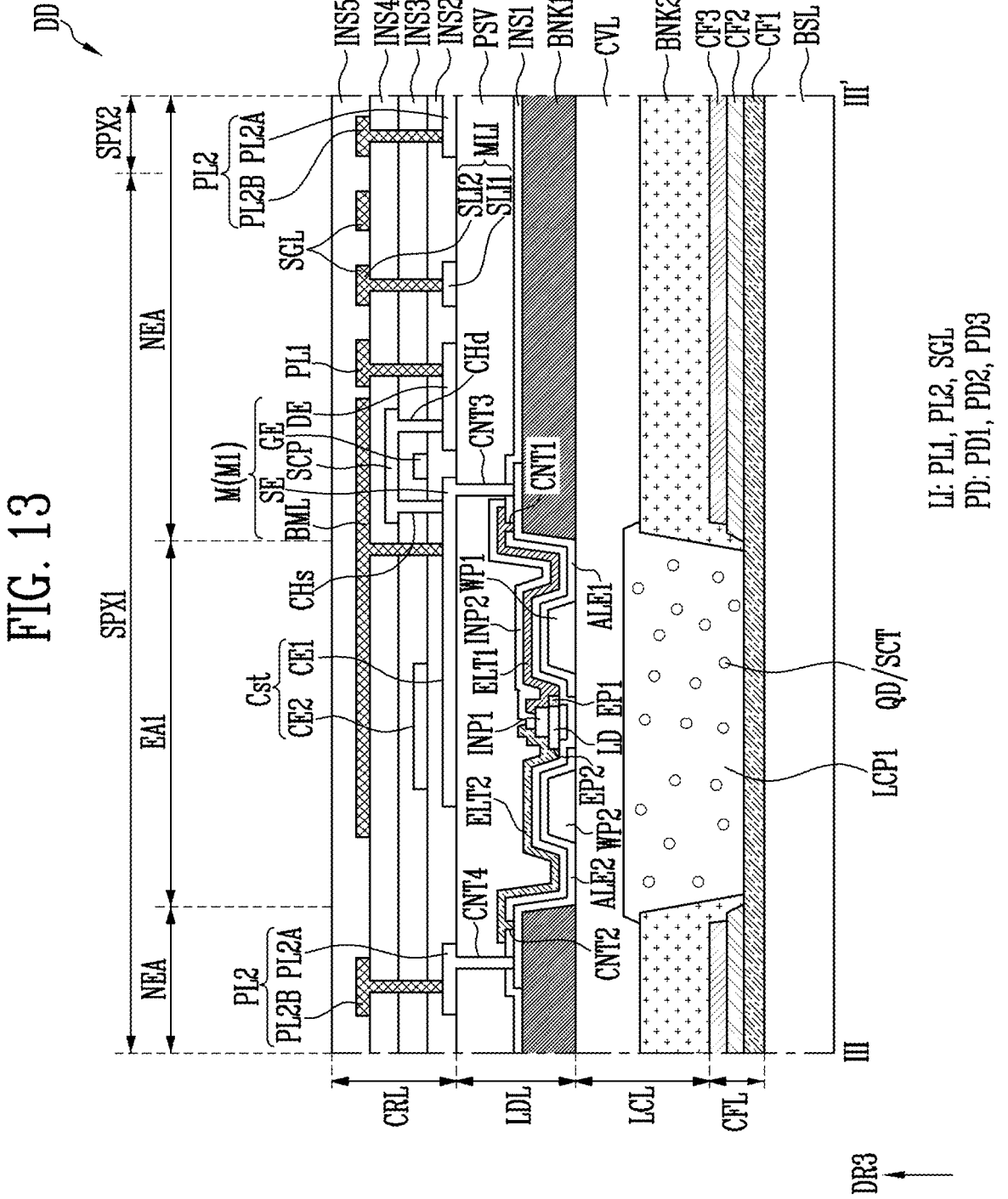
FIG. 13 is a cross-sectional view illustrating a pixel and a display device including the same according to one or more embodiments of the present disclosure.

FIG. 13 is a cross-sectional view illustrating a pixel PXL and a display device DD including the same according to one or more embodiments of the present disclosure. For example, FIG. 13 illustrates a cross-section of the display device DD corresponding to the cross-section of the pixel PXL (for example, a cross-section of the first sub-pixel SPX1) taken along the line III~III' of FIG. 9, and illustrates the cross-section of the display device DD including one area of the pixel PXL that does not overlap the pad area PA. In the embodiment of FIG. 13, the same reference numerals are given to configurations (for example, substantially identical or similar configurations) corresponding to those of the embodiment of FIG. 12, and a detailed description thereof is omitted.

Referring to FIGS. 3 to 13, at least one pixel PXL (or sub-pixel SPX) disposed in the display area DA may not overlap the pad area PA and/or the circuit board FPC. In this case, the pads PD (for example, the pads PD of FIG. 12) may not be disposed in the pixel area in which the at least one pixel PXL is disposed.

Figure 14:
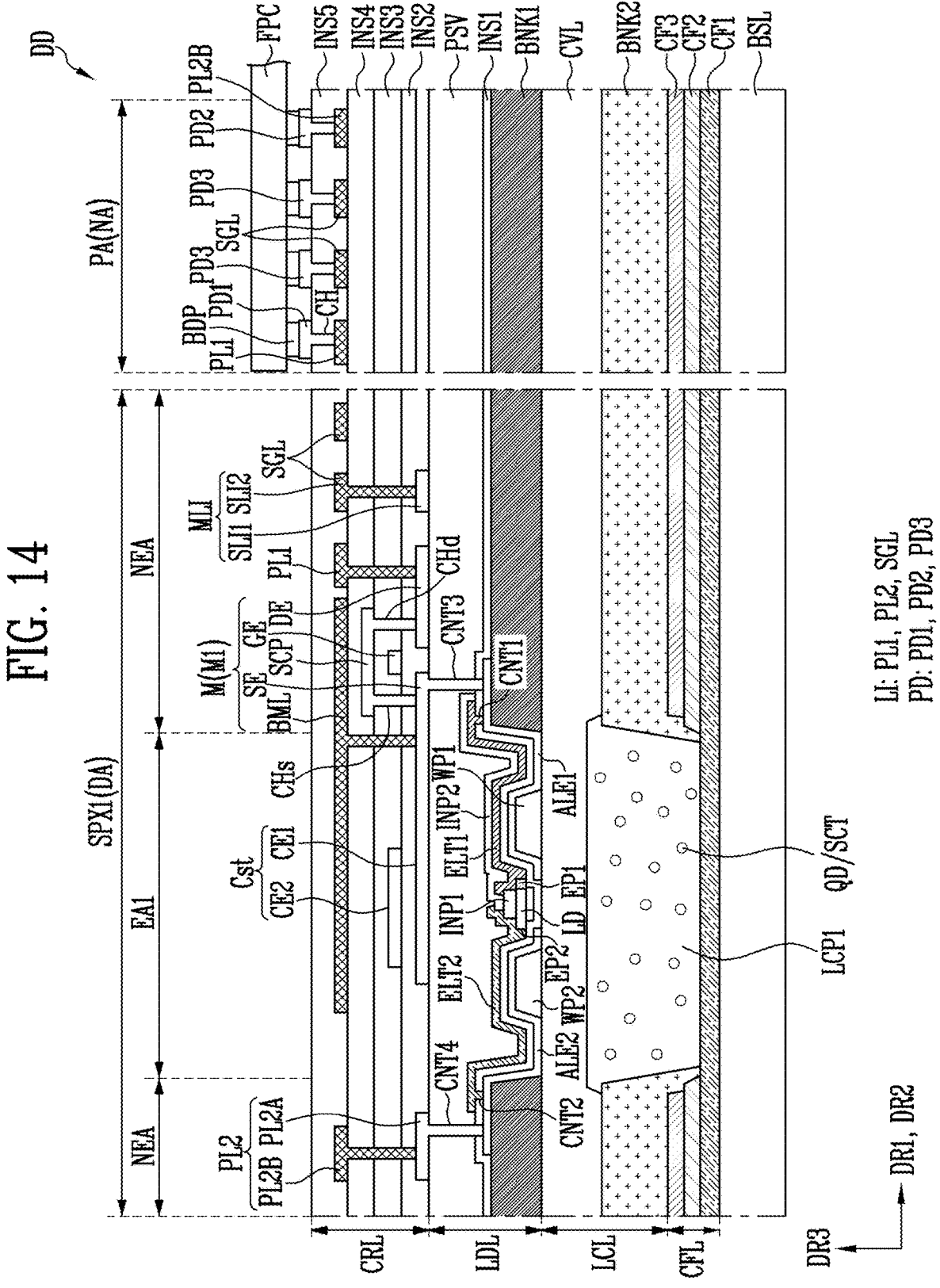
FIG. 14 is a cross-sectional view illustrating a display device according to one or more embodiments of the present disclosure.

FIG. 14 is a cross-sectional view illustrating a display device DD according to one or more embodiments of the present disclosure. For example, FIG. 14 schematically illustrates a cross-section of the display device DD including the display area DA and the non-display area NA. FIG. 14 illustrates a cross-section of the display area DA based on one area of any one pixel PXL (for example, one area of the first sub-pixel SPX1), and illustrates a cross-section of the non-display area NA based on the pad area PA in which at least some pads PD are formed. In the embodiment of FIG. 14, the same reference numerals are given to configurations (for example, substantially identical or similar configurations) corresponding to those of the embodiments of FIGS. 12 and 13, and a detailed description thereof is omitted.

Referring to FIGS. 3 to 14, the pad area PA may be formed in the non-display area NA of the display panel DP so as not to overlap the pixels PXL (or the sub-pixels SPX) of the display area DA. Accordingly, the circuit board FPC may be connected to the pads PD on the non-display area NA of the display panel DP.

In one or more embodiments, the circuit board FPC may be disposed only on the non-display area NA of the display panel DP so as not to overlap the display area DA. In one or more embodiments, a portion of the circuit board FPC (for example, a portion on which the bonding pads BDP are formed) may be disposed on the non-display area NA of the display panel DP and may be connected to the pads PD formed in the non-display area NA, and another portion of the circuit board FPC may overlap the display area NA.

In addition to the above-described embodiments, a position of the pad area PA and/or the circuit board FPC may be variously changed.

Although the technical spirit of the present disclosure has been described in detail in accordance with the above-described embodiments, it should be noted that the above-described embodiments are for the purpose of description and not of limitation. In addition, those skilled in the art may understand that various modifications are possible within the scope of the technical spirit of the present disclosure.

The scope of the present disclosure is not limited to the details described in the detailed description of the specification, but should be defined by the claims. In addition, it is to be construed that all changes or modifications derived from the meaning and scope of the claims and equivalent concepts thereof are included in the scope of the present disclosure.

What is claimed is:
1. A display device comprising:
a base layer;

a color filter layer on the base layer and comprising a color filter located at an emission area;

a light emitting element layer on the color filter layer and comprising a light emitting element located at the emission area, a first electrode on a first end of the light emitting element, and a second electrode on a second end of the light emitting element;

a light conversion layer between the color filter layer and the light emitting element layer;

a circuit layer on the light emitting element layer and comprising circuit elements and lines electrically connected to the first electrode and the second electrode; and pads on the circuit layer and connected to the lines, wherein the first electrode and the second electrode comprise a reflective conductive material, and wherein the light emitting element layer further comprises:

a first alignment electrode adjacent to the first end of the light emitting element and located under the first electrode;

a second alignment electrode adjacent to the second end of the light emitting element and located under the second electrode;

a first wall pattern under the first alignment electrode and protruding a portion of the first alignment electrode upward from a periphery of the first end of the light emitting element; and a second wall pattern under the second alignment electrode and protruding a portion of the second alignment electrode upward from a periphery of the second end of the light emitting element, and wherein a lower surface of the first wall pattern and a lower surface of the second wall pattern directly contact an upper surface of the light conversion layer.

2. The display device according to claim 1, wherein the first alignment electrode and the second alignment electrode comprise a transparent conductive material.

3. The display device according to claim 1, wherein the light emitting element layer further comprises a first bank in a non-emission area around the emission area to be around the emission area.

4. The display device according to claim 3, wherein the first electrode, the second electrode, the first alignment electrode, and the second alignment electrode extend from the emission area to the non-emission area.

5. The display device according to claim 3, wherein the light emitting element layer further comprises:

a first insulating layer covering the first alignment electrode and the second alignment electrode and located between the first electrode and the first alignment electrode and between the second electrode and the second alignment electrode;

a first contact portion comprising a portion that passes through the first insulating layer in the non-emission area and connects the first electrode and the first alignment electrode; and a second contact portion comprising a portion that passes through the first insulating layer in the non-emission area and connects the second electrode and the second alignment electrode.

6. The display device according to claim 5, wherein the circuit layer comprises:

a first transistor connected to the first alignment electrode;

a first power line connected to the first transistor; and a second power line connected to the second alignment electrode.

7. The display device according to claim 6, further comprising:

a third contact portion connecting the first alignment electrode and the first transistor; and a fourth contact portion connecting the second alignment electrode and the second power line.

8. The display device according to claim 7, wherein the third contact portion and the fourth contact portion are in the non-emission area.

9. The display device according to claim 6, wherein the circuit layer comprises:

a first conductive layer comprising a source electrode and a drain electrode of the first transistor;

a second conductive layer comprising a gate electrode of the first transistor;

a semiconductor layer comprising a semiconductor pattern of the first transistor; and a third conductive layer comprising at least one of the first power line and the second power line, wherein the first conductive layer, the second conductive layer, the semiconductor layer, and the third conductive layer are sequentially located on the light emitting element layer.

10. The display device according to claim 9, wherein the circuit layer further comprises a second insulating layer on the third conductive layer.

11. The display device according to claim 10, wherein the pads are on the second insulating layer and are connected to the lines through contact holes passing through the second insulating layer.

12. The display device according to claim 1, wherein the light conversion layer comprises a light conversion pattern in the emission area, and a second bank around the light conversion pattern, and wherein the light conversion pattern comprises at least one of light conversion particles that convert light of a first color emitted from the light emitting element into light of a second color, and light scattering particles.

13. The display device according to claim 1, further comprising:

a circuit board on the circuit layer and comprising bonding pads connected to the pads.

14. The display device according to claim 13, further comprising:

a pixel comprising the light emitting element, wherein the pixel emits light in a direction toward the base layer.

15. The display device according to claim 14, further comprising:

a display panel comprising the pixel, wherein the circuit board is on the display panel to overlap a display area in which the pixel is located.

16. The display device according to claim 1, wherein the first electrode and the second electrode comprise at least one metal layer.

17. A pixel comprising:

a color filter on a base layer;

a light emitting element layer on the color filter and comprising a light emitting element, a first electrode on a first end of the light emitting element, and a second electrode on a second end of the light emitting element;

a light conversion layer between the color filter and the light emitting element layer; and a circuit layer on the light emitting element layer and comprising circuit elements electrically connected to the first electrode and the second electrode, wherein the first electrode and the second electrode comprise a reflective conductive material, and wherein the light emitting element layer further comprises:

a first alignment electrode adjacent to the first end of the light emitting element and located under the first electrode;

a second alignment electrode adjacent to the second end of the light emitting element and located under the second electrode;

a first wall pattern under the first alignment electrode and protruding a portion of the first alignment electrode upward from a periphery of the first end of the light emitting element; and a second wall pattern under the second alignment electrode and protruding a portion of the second alignment electrode upward from a periphery of the second end of the light emitting element, and wherein a lower surface of the first wall pattern and a lower surface of the second wall pattern directly contact an upper surface of the light conversion layer.

* * * * *